(12) United States Patent
Chen et al.

(10) Patent No.: US 12,356,658 B2
(45) Date of Patent: *Jul. 8, 2025

(54) SEMICONDUCTOR STRUCTURE AND METHOD OF FORMING THE SAME

(71) Applicant: TAIWAN SEMICONDUCTOR MANUFACTURING COMPANY LTD., Hsinchu (TW)

(72) Inventors: Yi-Huan Chen, Hsinchu (TW); Chien-Chih Chou, New Taipei (TW); Szu-Hsien Liu, Hsinchu County (TW); Kong-Beng Thei, Hsinchu County (TW); Huan-Chih Yuan, Hsinchu County (TW); Jhu-Min Song, Nantou County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/669,565

(22) Filed: May 21, 2024

(65) Prior Publication Data
US 2024/0313111 A1    Sep. 19, 2024

Related U.S. Application Data

(63) Continuation of application No. 18/308,897, filed on Apr. 28, 2023, now Pat. No. 12,021,140, which is a continuation of application No. 17/321,255, filed on May 14, 2021, now Pat. No. 11,677,022.

(51) Int. Cl.
*H10D 30/66* (2025.01)
*H10D 30/01* (2025.01)
*H10D 62/10* (2025.01)
*H10D 64/27* (2025.01)

(52) U.S. Cl.
CPC ....... *H10D 30/668* (2025.01); *H10D 30/0297* (2025.01); *H10D 62/115* (2025.01); *H10D 64/513* (2025.01)

(58) Field of Classification Search
CPC ............ H01L 29/0649; H01L 29/4236; H01L 29/66734; H01L 29/7813; H10D 30/0297; H10D 30/668; H10D 62/115; H10D 64/513
USPC ........................................................ 257/330
See application file for complete search history.

(56) References Cited

U.S. PATENT DOCUMENTS 12,021,140 B2 *    6/2024    Chen .................. H01L 29/66621

* cited by examiner

*Primary Examiner* — Monica D Harrison
(74) *Attorney, Agent, or Firm* — WPAT LAW; Anthony King

(57) ABSTRACT

A semiconductor structure and a method for forming a semiconductor structure are provided. The semiconductor structure includes: a substrate; a gate electrode disposed within the substrate; a gate dielectric layer disposed within the substrate and surrounding the gate electrode; a plurality of first protection structures formed in an array disposed over the gate electrode; and a second protection structure comprising a ring shape from a top-view perspective, and disposed over the gate dielectric layer and at a same level as the plurality of first protection structures from a cross-sectional view.

20 Claims, 33 Drawing Sheets

SEMICONDUCTOR STRUCTURE AND METHOD OF FORMING THE SAME

PRIORITY CLAIM AND CROSS-REFERENCE

This application is a continuation application of U.S. patent application Ser. No. 18/308,897 filed Apr. 28, 2023, which claims priority and is a continuation application of U.S. patent application Ser. No. 17/321,255 filed May 14, 2021, now U.S. Pat. No. 11,677,022B2, the disclosures of which are hereby incorporated by reference in their entirety.

BACKGROUND

Electronic equipment using semiconductor devices is essential for many modern applications. In the semiconductor devices, it is desirable to improve transistor performance even as devices become smaller due to ongoing reductions in device scale. Further, it is desirable to manufacture integrated circuit semiconductor devices that incorporate transistors operated at various ranges of operating voltages in a single integrated circuit. However, the manufacturing of the integrated circuit that incorporates transistors operated at different voltages involve extra steps and operations, thereby increasing manufacturing cost and time. As such, there are many challenges in efficiently integrating transistors of different operating voltages in a single semiconductor substrate.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
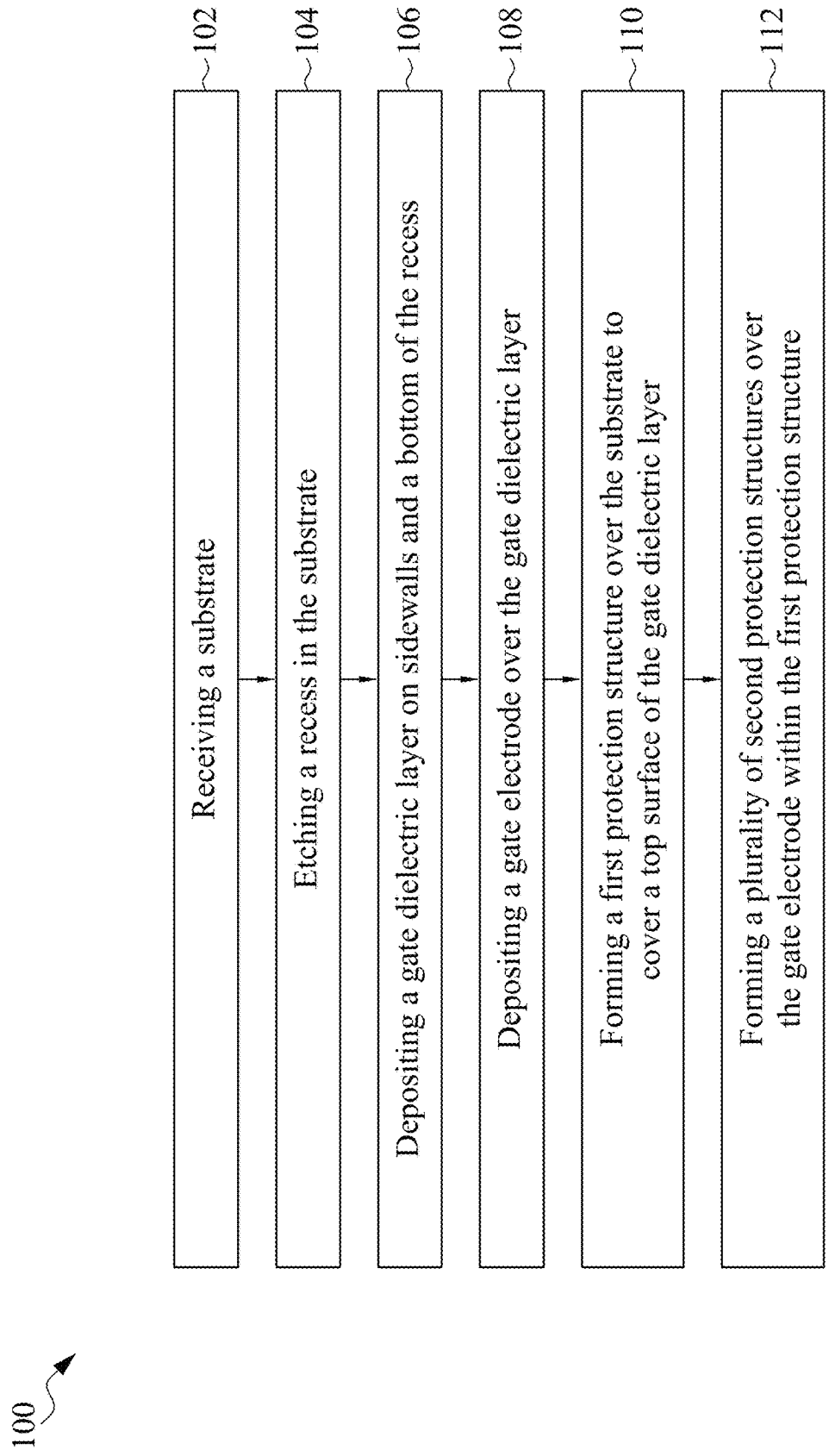
FIG. 1 is a flowchart representing a method for forming a semiconductor structure according to aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

Along the development of semiconductor industry, it has been a trend to fabricate as many semiconductor devices as possible on a single chip. For example, different semiconductor devices operated at ranges of low voltages, medium voltages, and high voltages are manufactured in a single chip. Generally, these semiconductor devices with different operating voltages are manufactured using different processes. For example, semiconductor devices manufactured by the replacement gate technology, also known as high-k metal gate (HKMG) technology, may be applied in the low-voltage devices. However, there are concerns in integrating the processes of manufacturing high-voltage devices or medium-voltage devices with those of manufacturing low-voltage devices, especially for the 28-nm technology node and beyond. To increase the yield of device integration, various factors should be considered, such as various device dimensions, e.g., different gate dielectric thicknesses, channel lengths, and/or channel widths of devices with different operating voltages. Also, since planarization processes are needed when fabricating the devices (used for planarizing metals or interlayer dielectrics for example), the dishing effect (applied to the high-voltage devices or medium-voltage devices with large device areas) may degrade the device performance.

Embodiments of a semiconductor structure and a forming method thereof are therefore provided. The semiconductor structure may have a first-voltage device disposed in a first device region and a second-voltage device disposed in a second device region. In some embodiments, the method for forming the semiconductor structure includes forming the low-voltage devices over the high/medium-voltage devices to share the HKMG processes of forming replacement gates in order to reduce manufacturing cost. The method further includes forming a protection structure prior to the forming of the low-voltage devices to provide structural support during the planarization processes.

FIG. 1 is a flowchart representing a method 100 for forming a semiconductor structure 200 according to aspects of one or more embodiments of the present disclosure. The method 100 for forming the semiconductor structure 200 includes an operation 102 where a substrate is received. The method 100 further includes an operation 104 where a recess is etched in the substrate. The method 100 further includes an operation 106 where a first gate dielectric layer is deposited on sidewalls and a bottom of the recess. The method 100 further includes an operation 108 where a gate electrode is deposited over the gate dielectric layer. The method 100 further includes an operation 110 where a first protection structure is formed over the substrate to cover a top surface of the gate dielectric layer. The method 100 further includes an operation 112 where a plurality of second protection structures are formed over the gate electrode within the first protection structure.

FIGS. 2 through 30 are schematic drawings illustrating the semiconductor structure 200 at different fabrication stages constructed according to aspects of one or more embodiments of the present disclosure.

Figure 2:
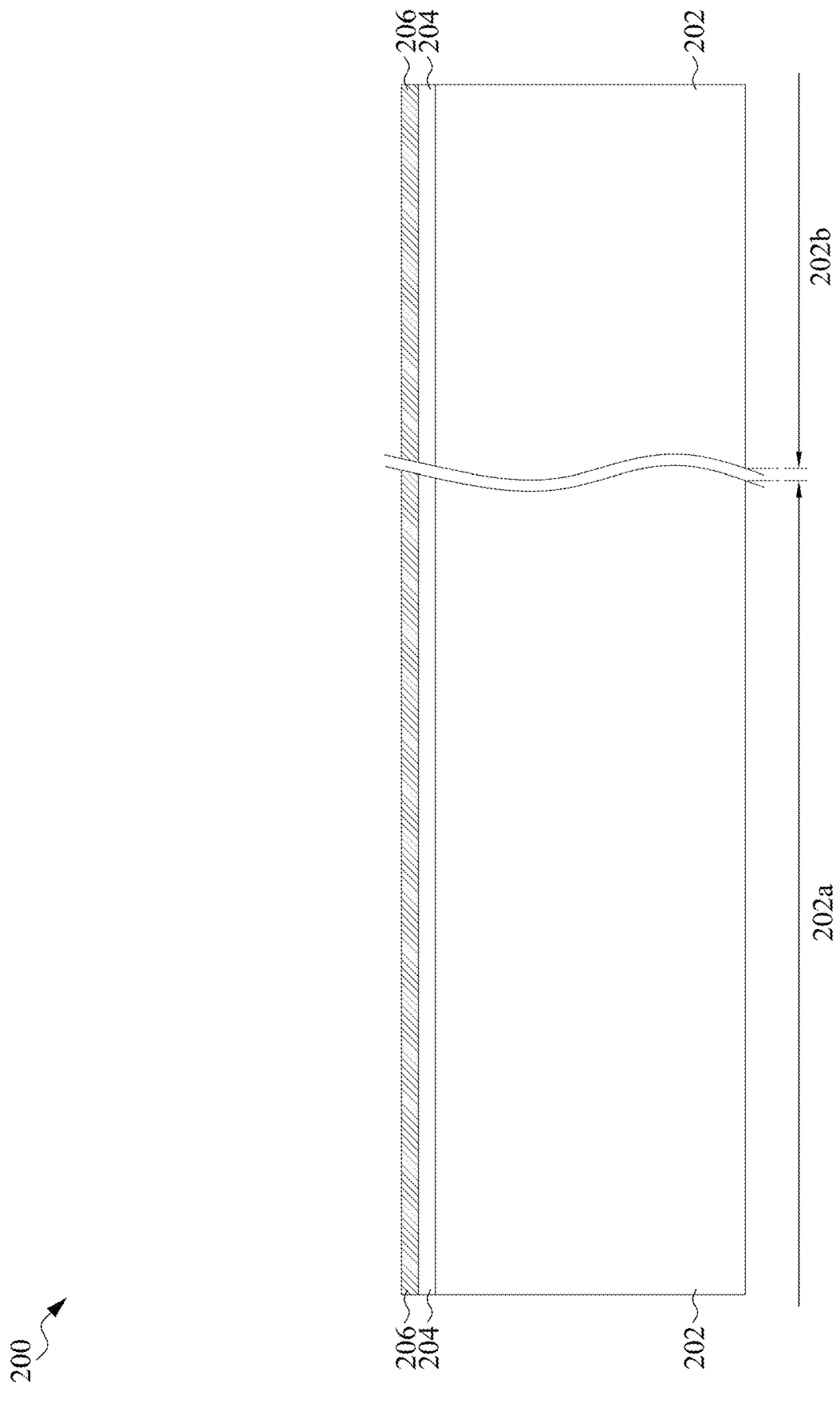
FIGS. 2 through 30 are cross-sectional views of a semiconductor structure at different fabrication stages constructed according to aspects of one or more embodiments of the present disclosure.

Referring to FIG. 2, a substrate 202 is received or formed according to operation 102. The substrate 202 may be a semiconductor wafer such as a silicon wafer. Alternatively or additionally, the substrate 202 may include elementary semiconductor materials, compound semiconductor materials, or alloy semiconductor materials. Examples of elementary semiconductor materials may be, for example but not limited thereto, single crystal silicon, polysilicon, amorphous silicon, germanium (Ge), and/or diamond. Examples of compound semiconductor materials may be, for example but not limited thereto, silicon carbide (SiC), gallium arsenic (GaAs), gallium phosphide (GaP), indium phosphide (InP), indium arsenide (InAs), and/or indium antimonide (InSb). Examples of alloy semiconductor material may be, for example but not limited thereto, SiGe, GaAsP, AlInAs, AlGaAs, GaInAs, GaInP, and/or GaInAsP. The substrate 202 may also be a bulk semiconductor substrate or a Semiconductor-On-Insulator (SOI) substrate. In accordance with some exemplary embodiments, the substrate 202 is doped with p-type impurities. In alternative embodiments, the substrate 202 is doped with n-type impurities.

The substrate 202 may include various device regions. In some embodiments, the substrate 202 includes a first device region 202a and a second device region 202b. The first device region 202a and the second device region 202b may include different devices with different operating voltage ranges. For example, the first device region 202a is a first-voltage device region in which a first-voltage device 210a (see FIG. 27) is formed. The second device region 202b is a second-voltage device region in which a second-voltage device 210b (see FIG. 27) is formed. The second-voltage device 210b is configured to operate at operating voltages (or supply voltages) lower than the respective operating voltages (or supply voltages) of the first-voltage device 210a. In accordance with some exemplary embodiments, the first device region 202a is a high-voltage (HV) MOS device region or a medium-voltage (MV) MOS device region, while the second device region 202b is a low-voltage (LV) MOS device region.

It is appreciated that the HV, MV, and LV MOS devices are related each other in their operating voltages. The HV MOS devices are configured to operate at a voltage range (or supply voltages) higher than that of the MV MOS devices, and the MV MOS devices are configured to operate at a voltage range (or supply voltages) higher than that of the LV MOS devices. Also, the maximum allowable voltages in the MV MOS devices are lower than the maximum allowable voltages in HV MOS devices, and the maximum allowable voltages in the LV MOS devices are lower than the maximum allowable voltages in the MV MOS devices. In accordance with some exemplary embodiments, the operating voltages (or the supply voltages) of the HV MOS devices are between about 20 V and about 30 V, the operating voltages (or the supply voltages) of the MV MOS devices are between about 5.0 V and about 10 V, and the operating voltages (or the supply voltages) of the LV MOS devices are between about 0.5 V and about 3.0V.

FIGS. 2 through 5 illustrate the formation of shallow trench isolation (STI) regions. Referring to FIG. 2, a pad layer 204 and a mask layer 206 are formed over the substrate 202. The pad layer 204 may include a thin film formed of silicon oxide, which may be formed, for example, using a thermal oxidation process. The pad layer 204 may serve as an adhesion layer between the substrate 202 and the mask layer 206. The pad layer 204 may also serve as an etch stop layer during etching the mask layer 206. In accordance with some embodiments of the present disclosure, the mask layer 206 is formed of silicon nitride, which may be formed, for example, using Low-Pressure Chemical Vapor Deposition (LPCVD), thermal nitridation of silicon, Plasma-Enhanced Chemical Vapor Deposition (PECVD), or plasma anodic nitridation. The mask layer 206 may be used as a hard mask during subsequent photolithography process.

Figure 3:
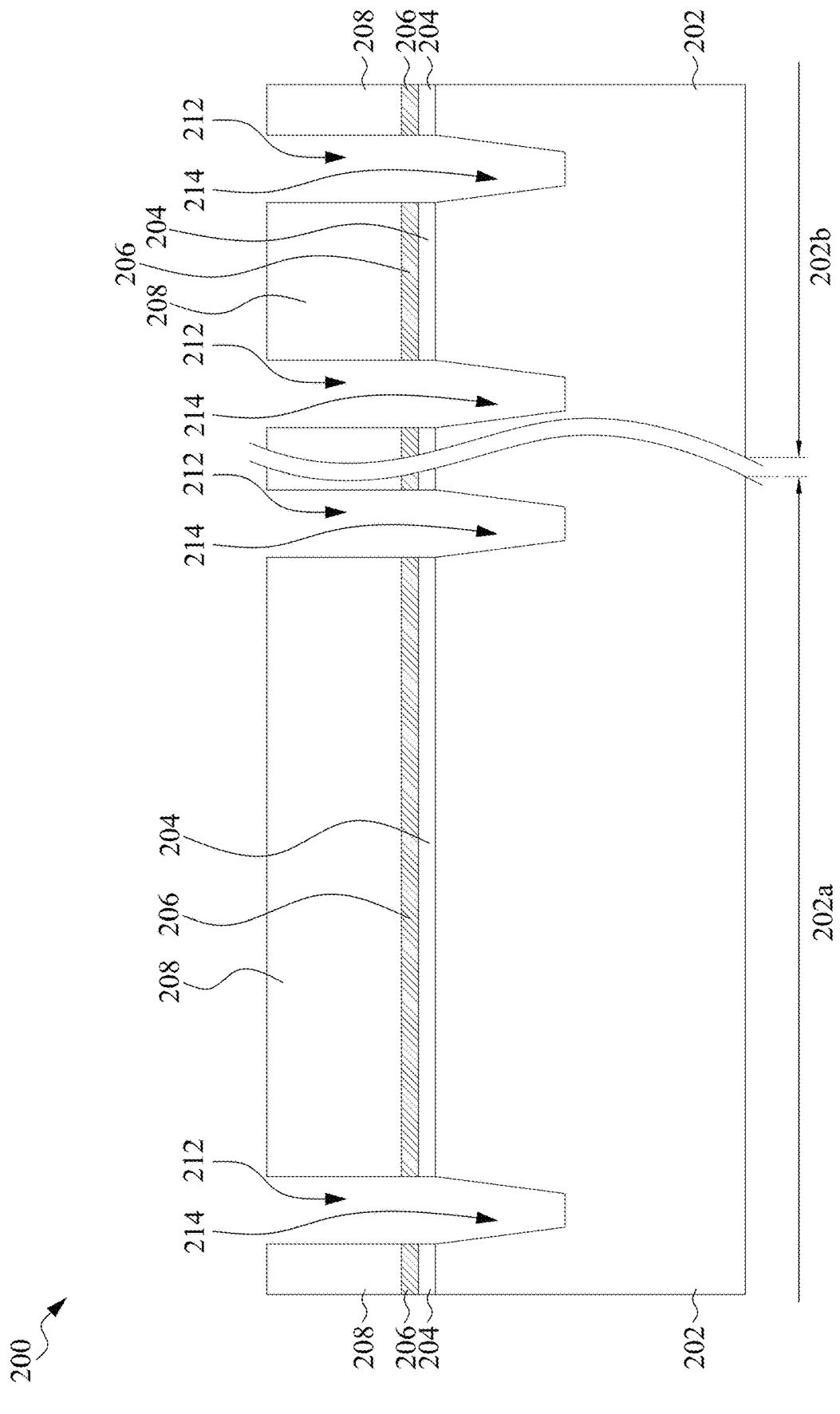

Referring to FIG. 3, a photo resist layer 208 is formed on the mask layer 206 and is then patterned to form openings 212. The mask layer 206 and the pad layer 204 are etched through the openings 212, exposing the underlying substrate 202. The exposed substrate 202 is then etched, forming trenches 214. The photo resist layer 208 is then removed.

Figure 4:
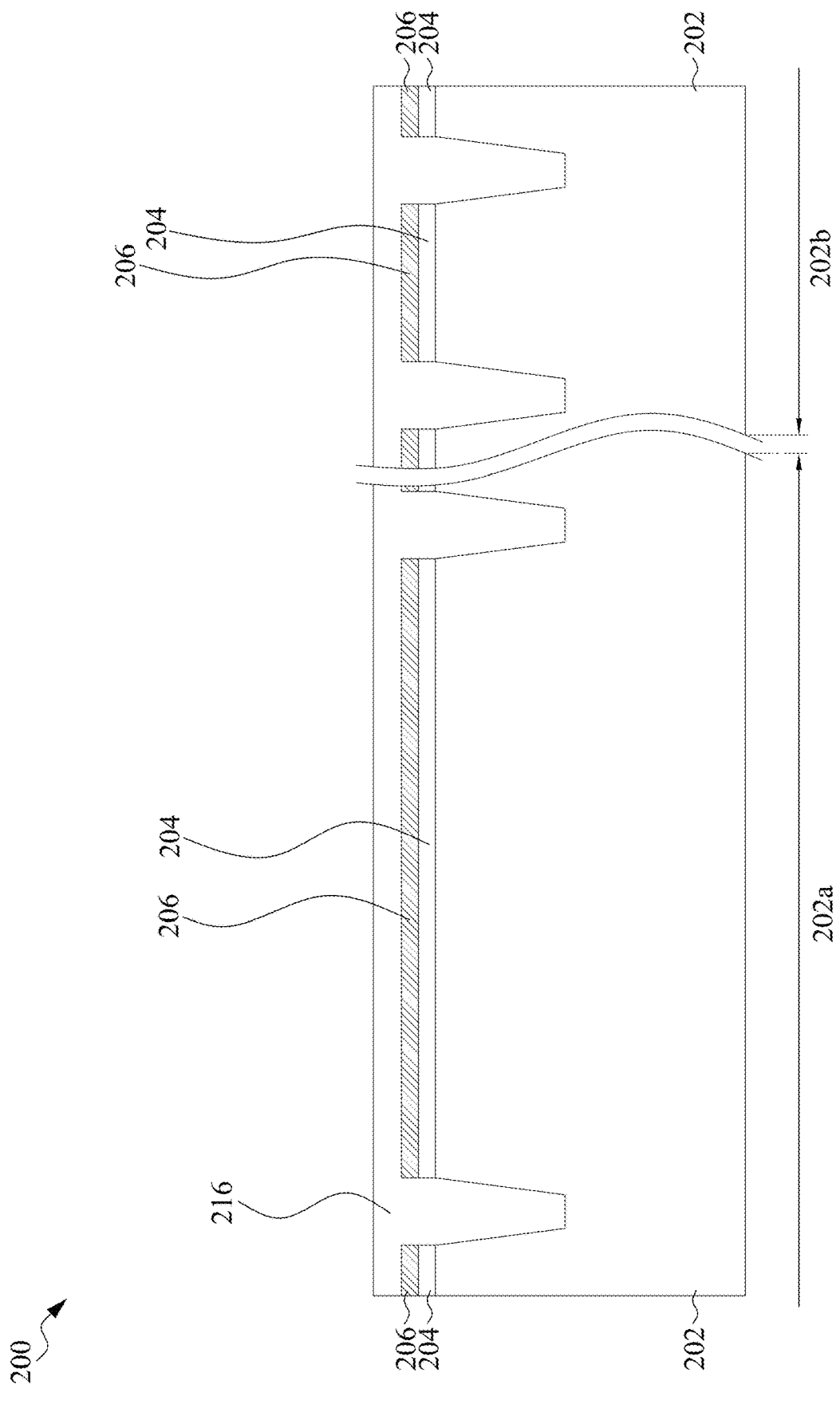

Referring to FIG. 4, dielectric material(s) 216 is filled into the trenches 214. In some embodiments, the dielectric material 216 includes a liner oxide lining the bottoms and the sidewalls of the opening 212. The liner oxide may be a thermal oxide layer forming by oxidizing a surface layer of the exposed substrate 202. In other embodiments, the liner oxide is formed using a deposition technique that can form conformal oxide layers. In some embodiments, after the formation of the liner oxide, the remaining portions of the trenches 214 are filled with another dielectric material. In some embodiments, the filling material includes silicon oxide, and other dielectric materials such as SiN, SiC, SiON, or the like, may also be used.

Figure 5:
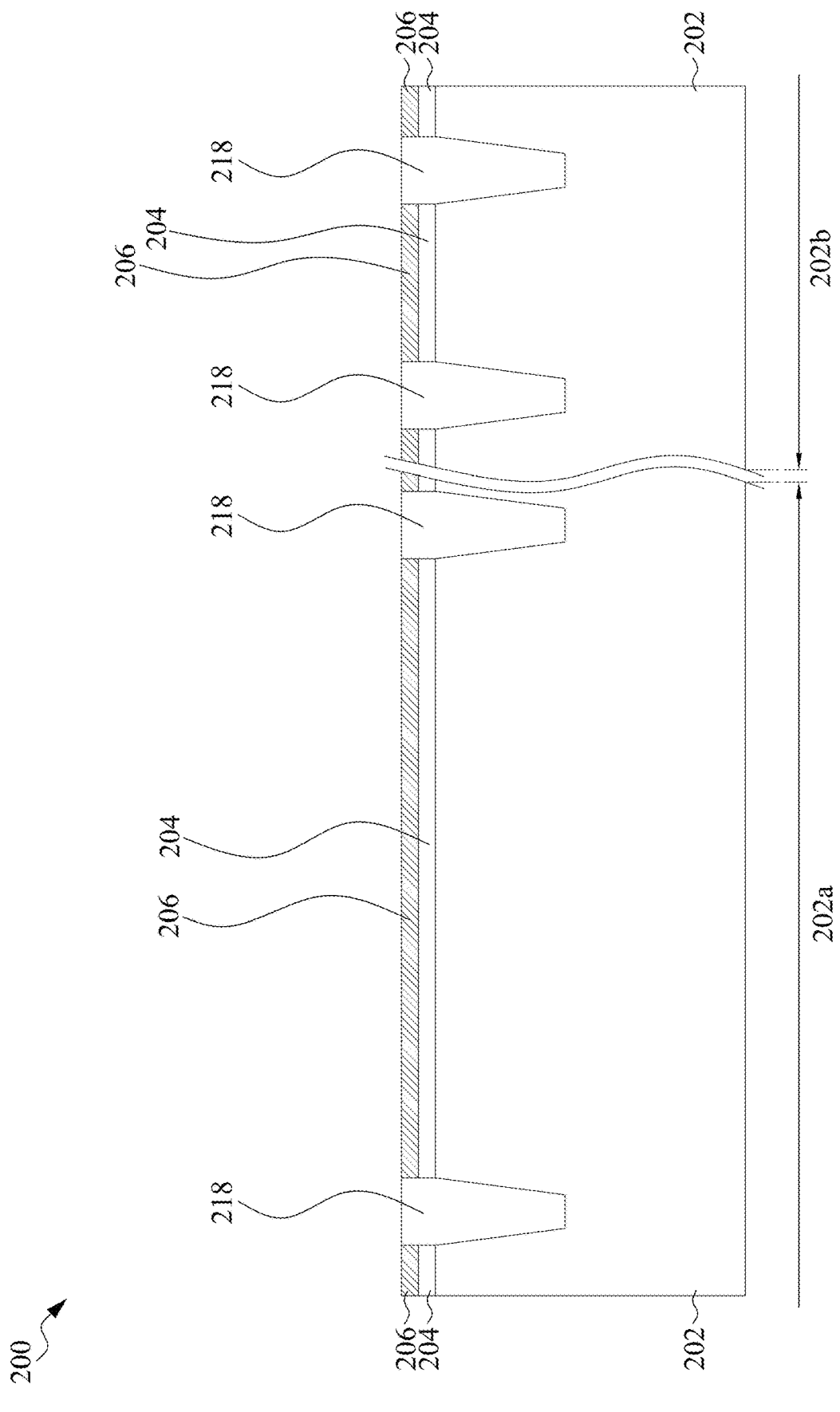

Referring to FIG. 5, a planarization such as Chemical Mechanical Polish (CMP) is then performed to remove excess portions of the dielectric material 216 over the top surface of the mask layer 206. The mask layer 206 may serve as a CMP stop layer. The remaining portion of the dielectric material 216 forms isolation structures 218. In some embodiments, the bottom surfaces of isolation structures 218 are substantially level with each other.

Figure 6:
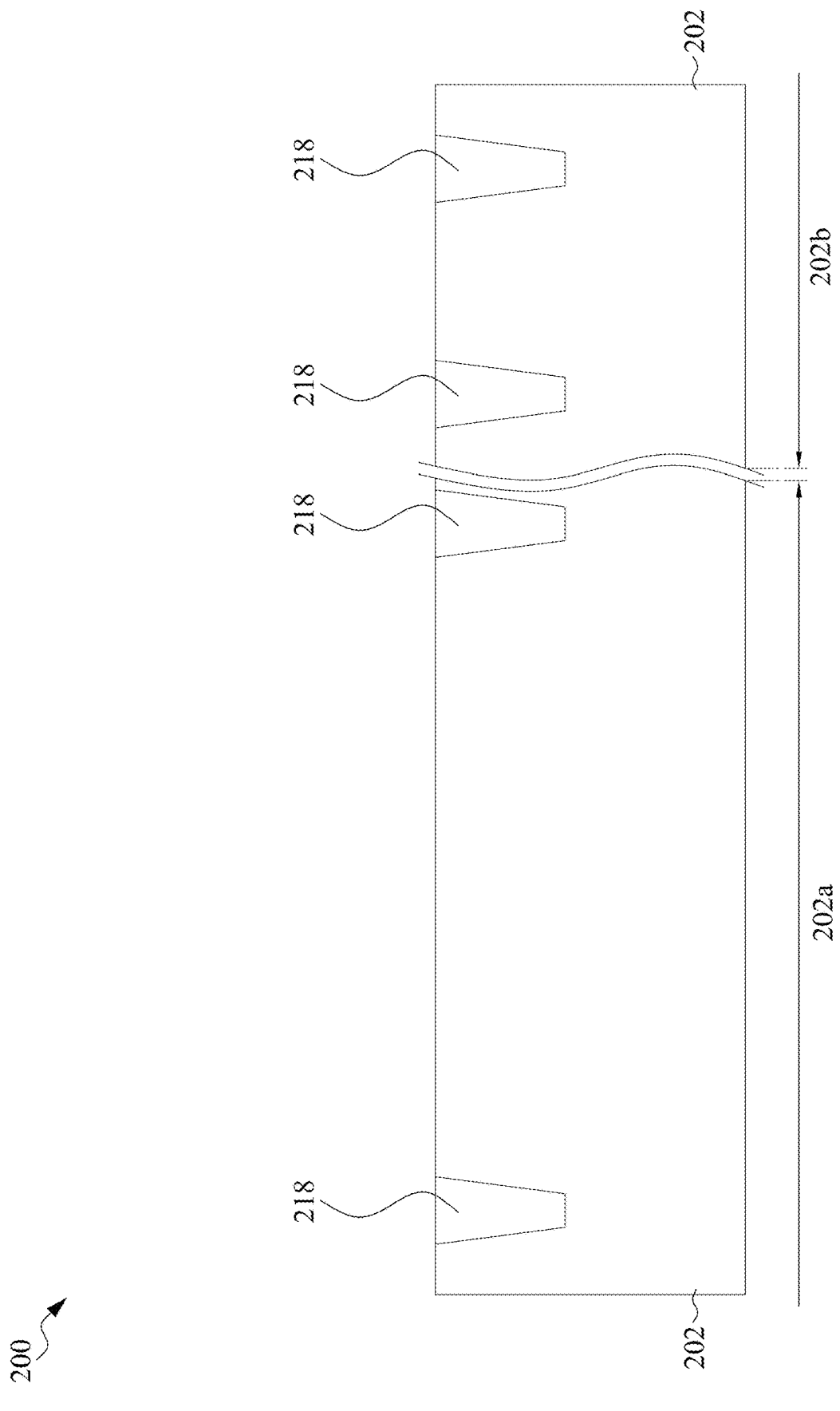

Referring to FIG. 6, in subsequent steps, the mask layer 206 and the pad layer 204 are removed. In some embodiments, the mask layer 206 and the pad layer 204 are removed by etching processes.

Figure 7:
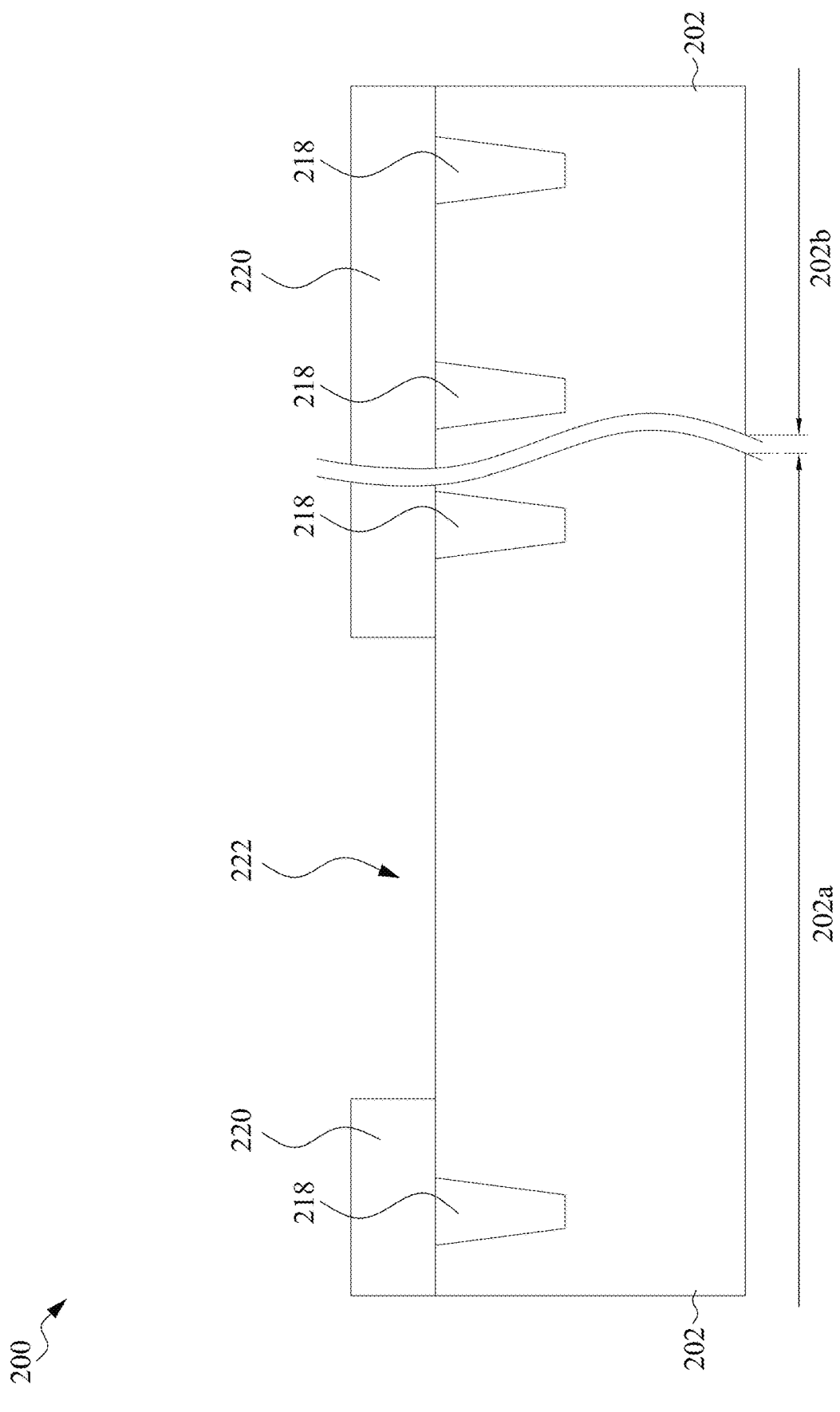

Referring to FIG. 7, a photo resist layer 220 is formed over the substrate 202 and patterned to form an opening 222. A portion of the substrate 202 is exposed through the opening 222. In some embodiments, at least a portion in the first device region 202a of the substrate 202 is exposed through the opening 222, while the second device region 202b of the substrate 202 is covered by the photo resist layer 220. The photo resist layer 220 may further cover the isolation structures 218 in the first device region 202a and the second device region 202b.

Figure 8:
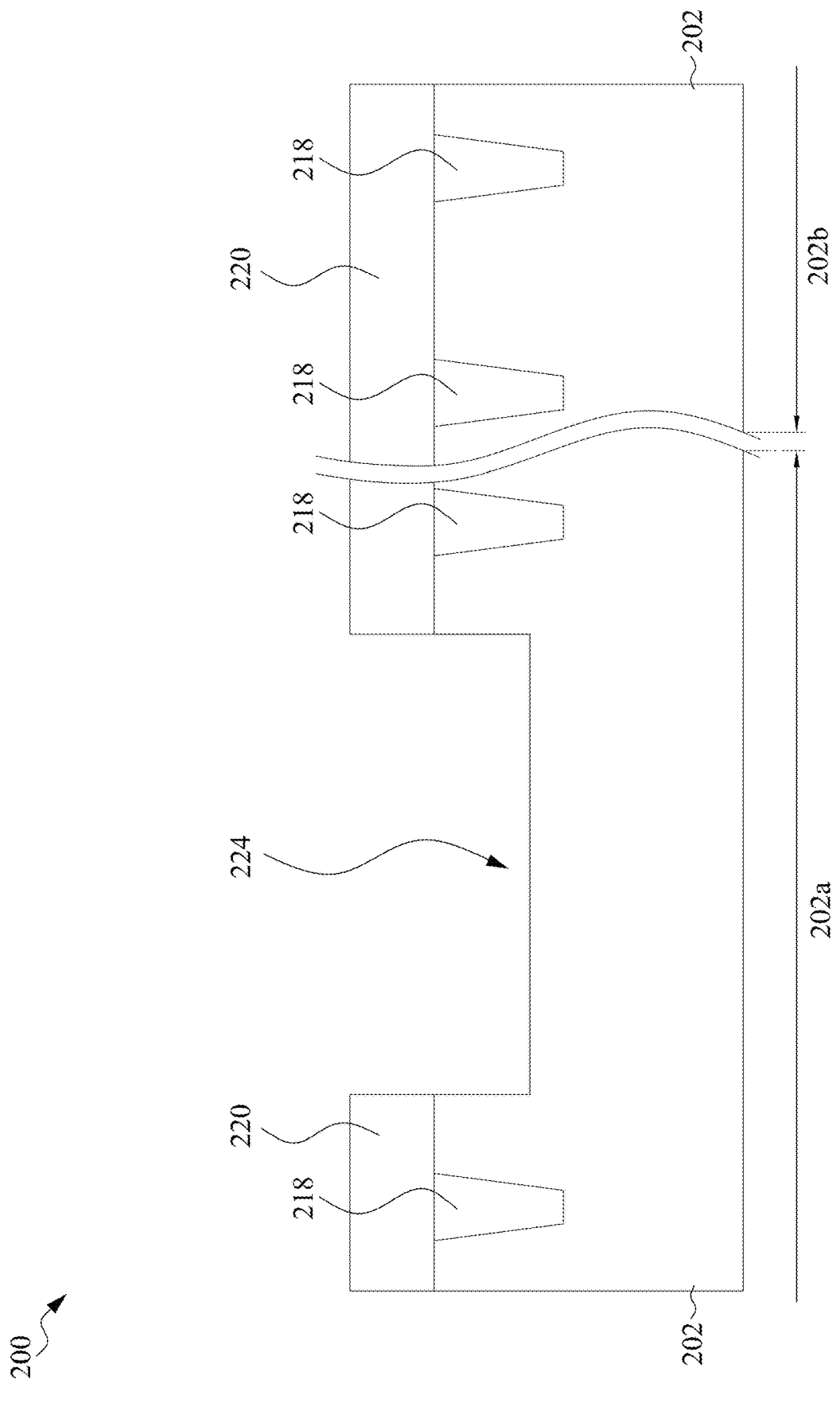
Figure 9:
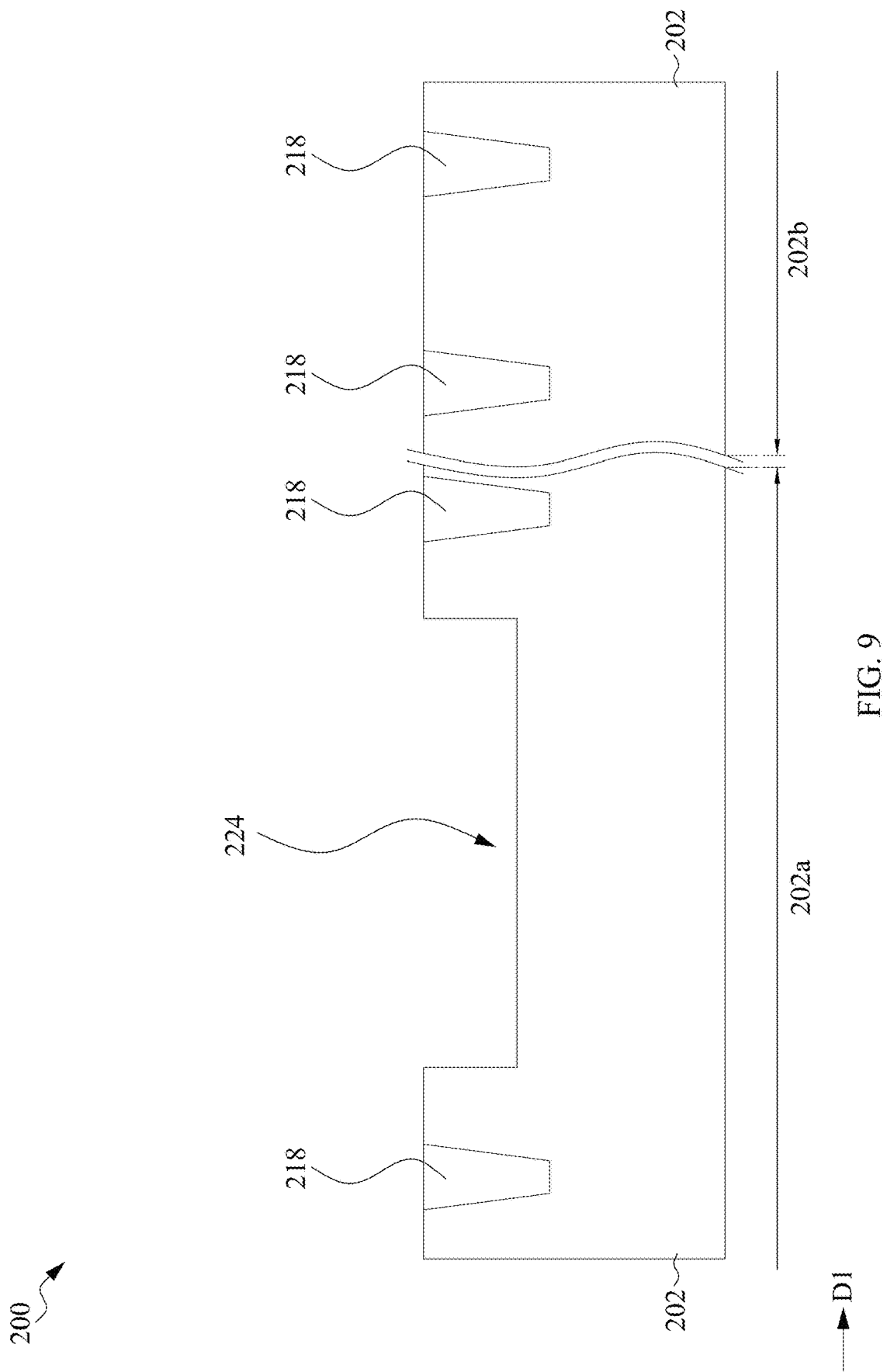

Referring to FIG. 8, the portion of the exposed substrate 202 is etched, forming a recess 224 in the first device region 202a. The respective step is shown as operation 104 of the method 100 shown in FIG. 1. The etching may be performed through a dry etching process using an etching gas. The etching may also be performed through a wet etching process using an etching solution. As a result of the etching, an upper portion of the substrate 202 in the first device region 202a is removed. In some embodiments, a depth of the recess 224 may be less than a depth of the isolation structures 218. In alternative embodiments, the depth of the recess 224 may be substantially same as the depths of the isolation structures 218. The depth of the recess 224 is determined by various factors, such as the thickness of the gate dielectric 242 and the thickness of the gate electrode 244 to be formed (see FIG. 14). For example, the depth of the recess 224 is so selected that the thickness of the gate dielectric 242 may meet the voltage-sustaining requirement for HV MOS devices or MV MOS devices. The etching process may be adjusted to determine the maximum allowable voltage and the saturation current of the resulting HV MOS device or MV MOS device. After the etching, the photo resist layer 220 is removed, as shown in FIG. 9.

Figure 10:
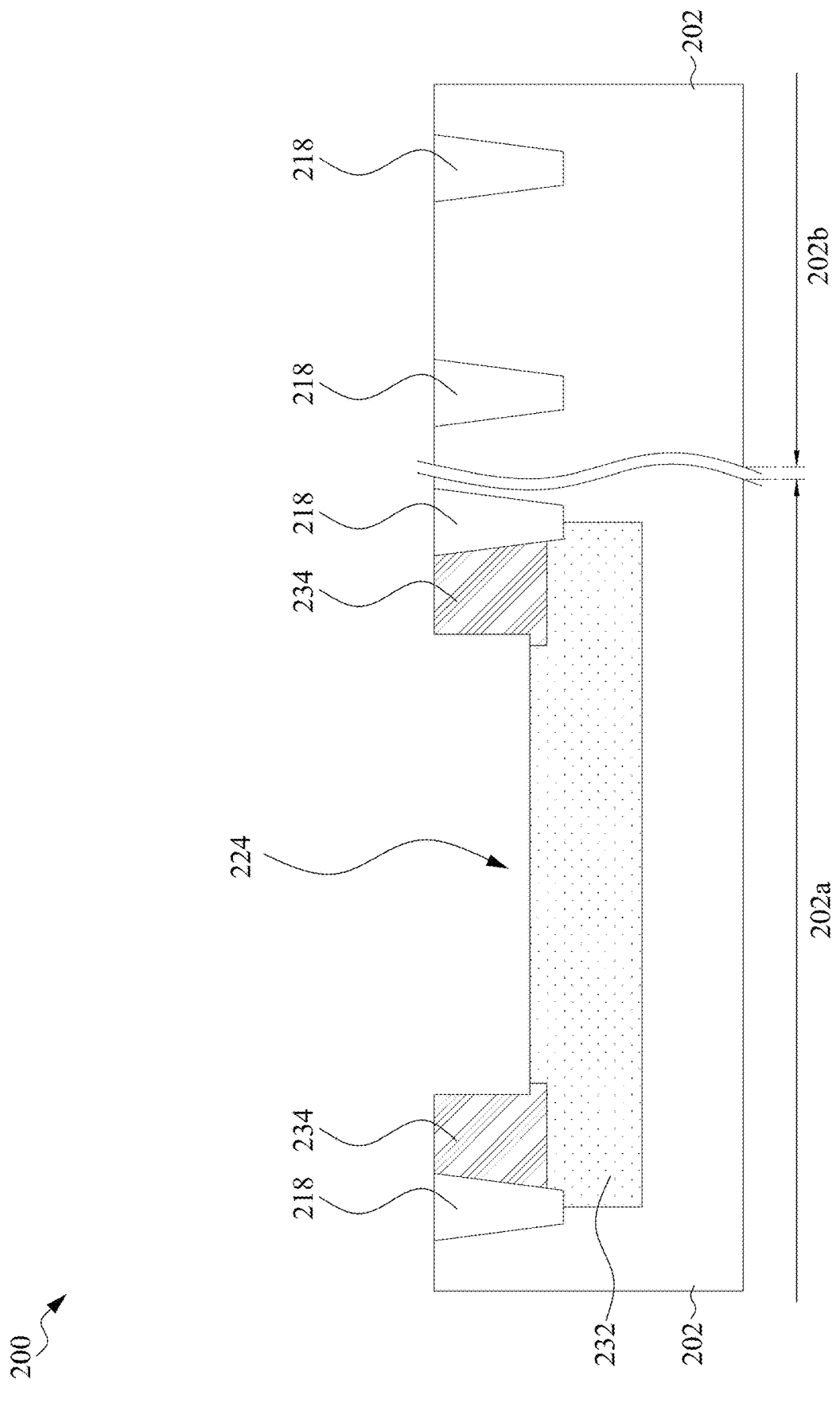
Figure 11:
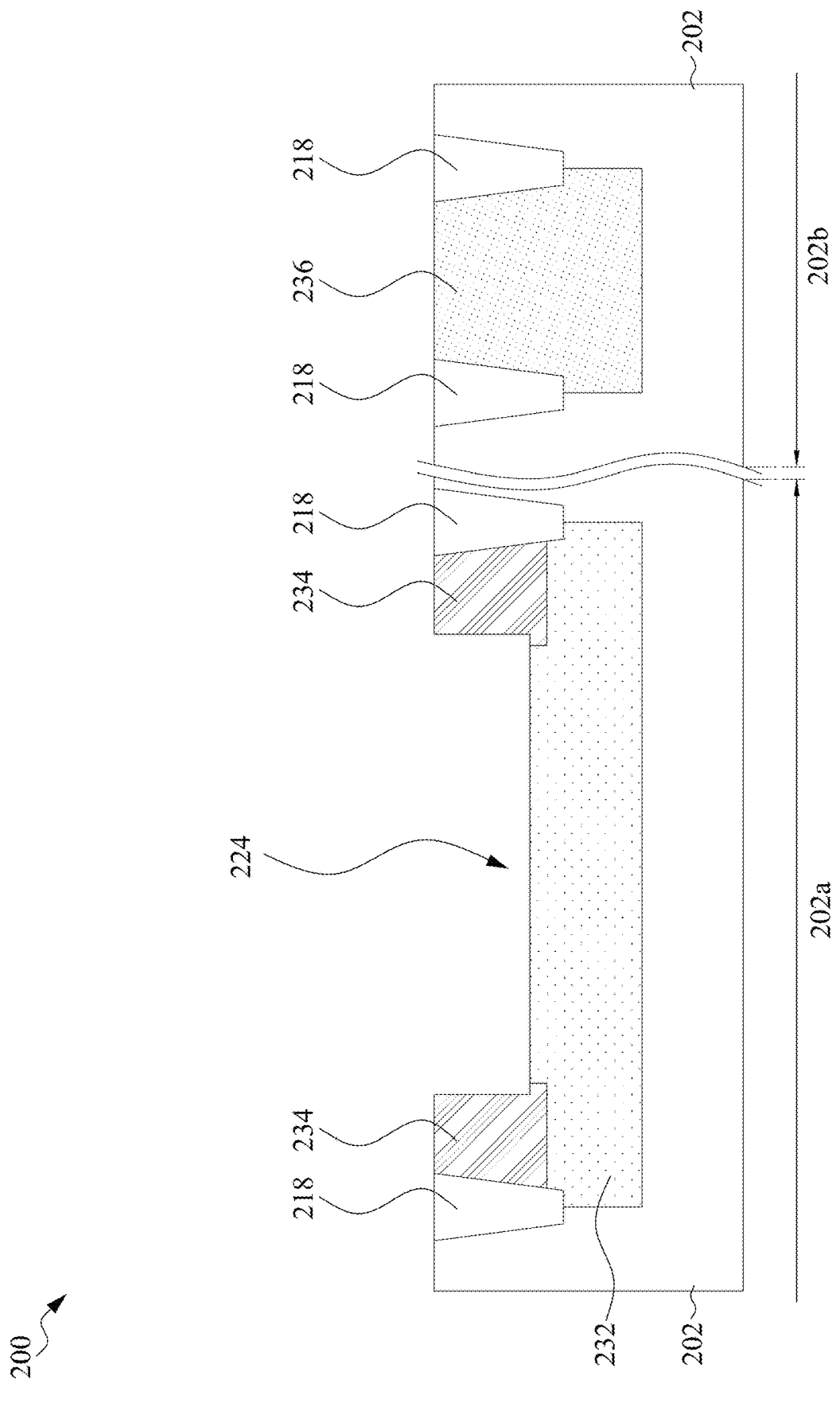

FIGS. 10 and 11 illustrate the formation of a plurality of doped regions through a plurality of implantation processes. The plurality of doped regions may include a deep well region 232, at least two shallow doped regions 234 in the first device region 202a and a deep well region 236 in the second device region 202b. In some embodiments, the deep well regions 232 and 236 are p-type regions, and the shallow doped regions 234 are n-type regions. In alternative embodiments, the deep well regions 232 and 236 are n-type regions, and the shallow doped regions 234 are p-type regions. The implantation processes for forming the deep well regions 232, 236, and the shallow doped regions 234 may be arranged in any order.

Referring to FIG. 10, a photo resist layer (not shown) is formed to cover the substrate 202. The region in which the deep well region 232 and the shallow doped regions 234 are to be formed is exposed to the opening of the photo resist layer. In some embodiments, p-type dopants, such as boron and/or indium, are implanted into substrate 202 to form the deep well region 232. In some embodiments, n-type dopants, such as phosphorous, arsenic, and/or antimony, are implanted to form the shallow doped regions 234. The photo resist layer is then removed after the implantation operation is completed.

Referring to FIG. 11, another photo resist layer (not shown) is formed to cover the substrate 202, with the region in which the deep well region 236 is to be formed exposed to the opening of the photo resist layer. An implantation may be then performed in order to form deep well region 236. The deep well region 236 may be implanted with p-type dopants, such as boron or indium. In some embodiments, the deep well region 236 has an impurity concentration greater than that of the deep well region 232. The photo resist layer is then removed after the implantation operation is completed.

Figure 12:
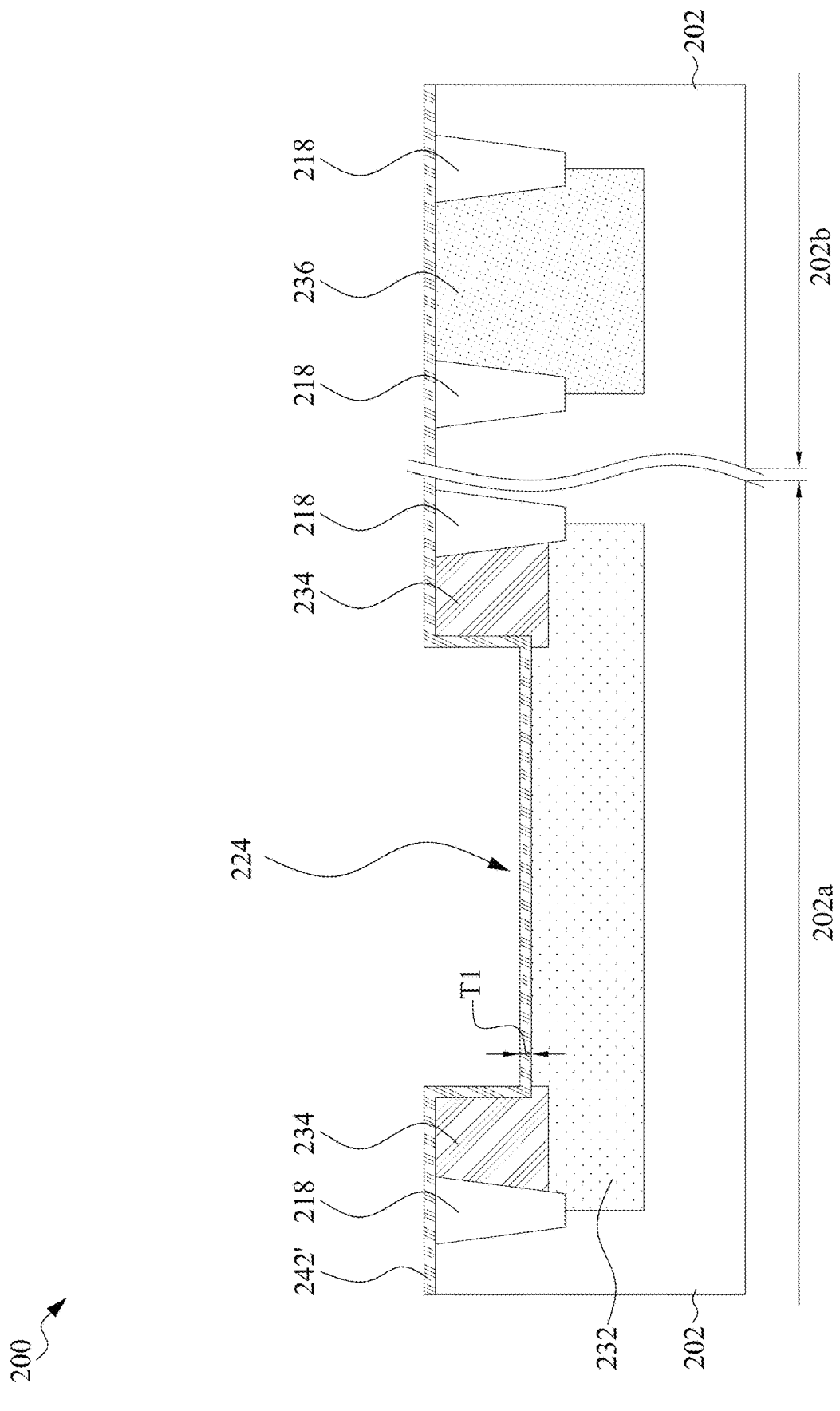
Figure 13:
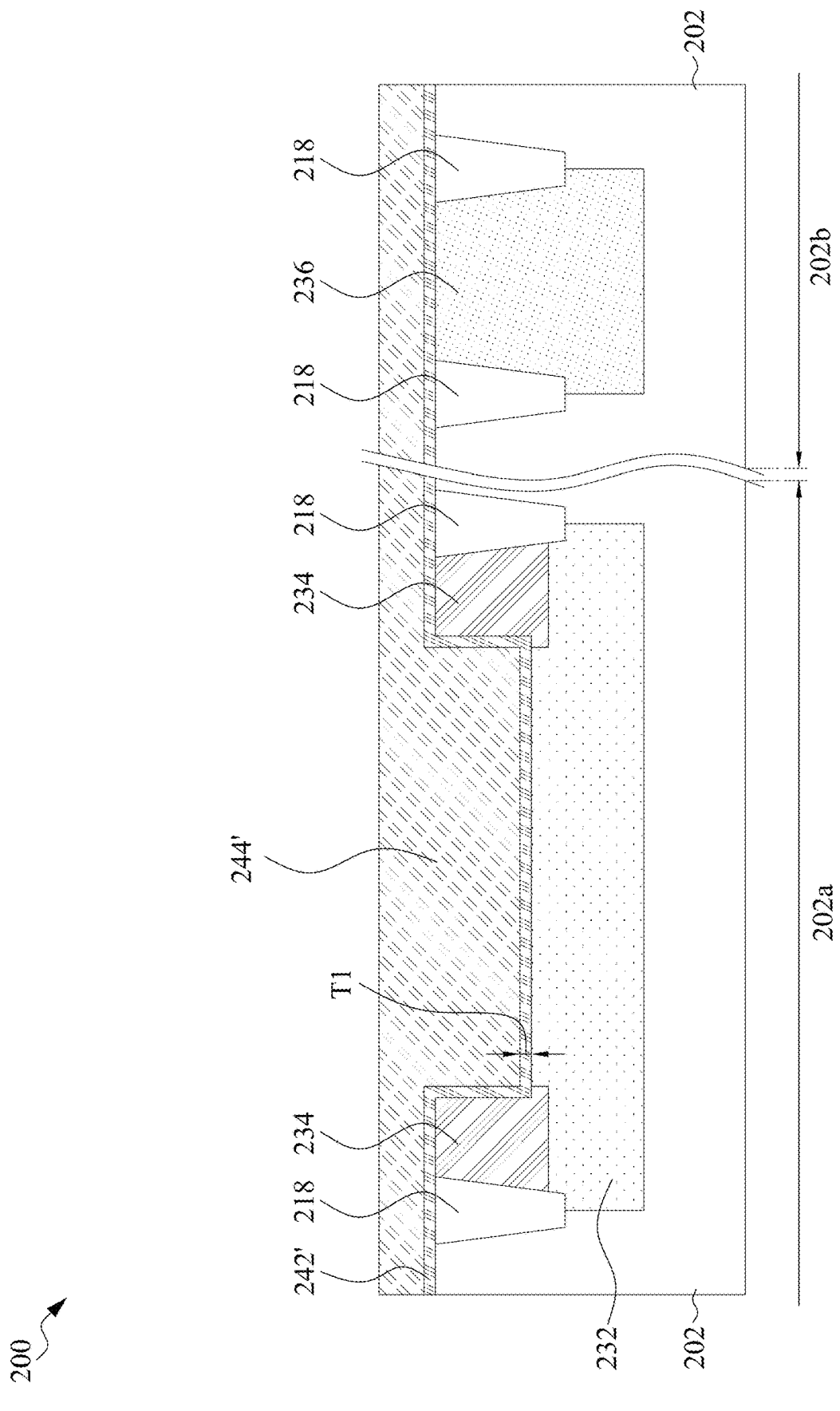
Figure 14:
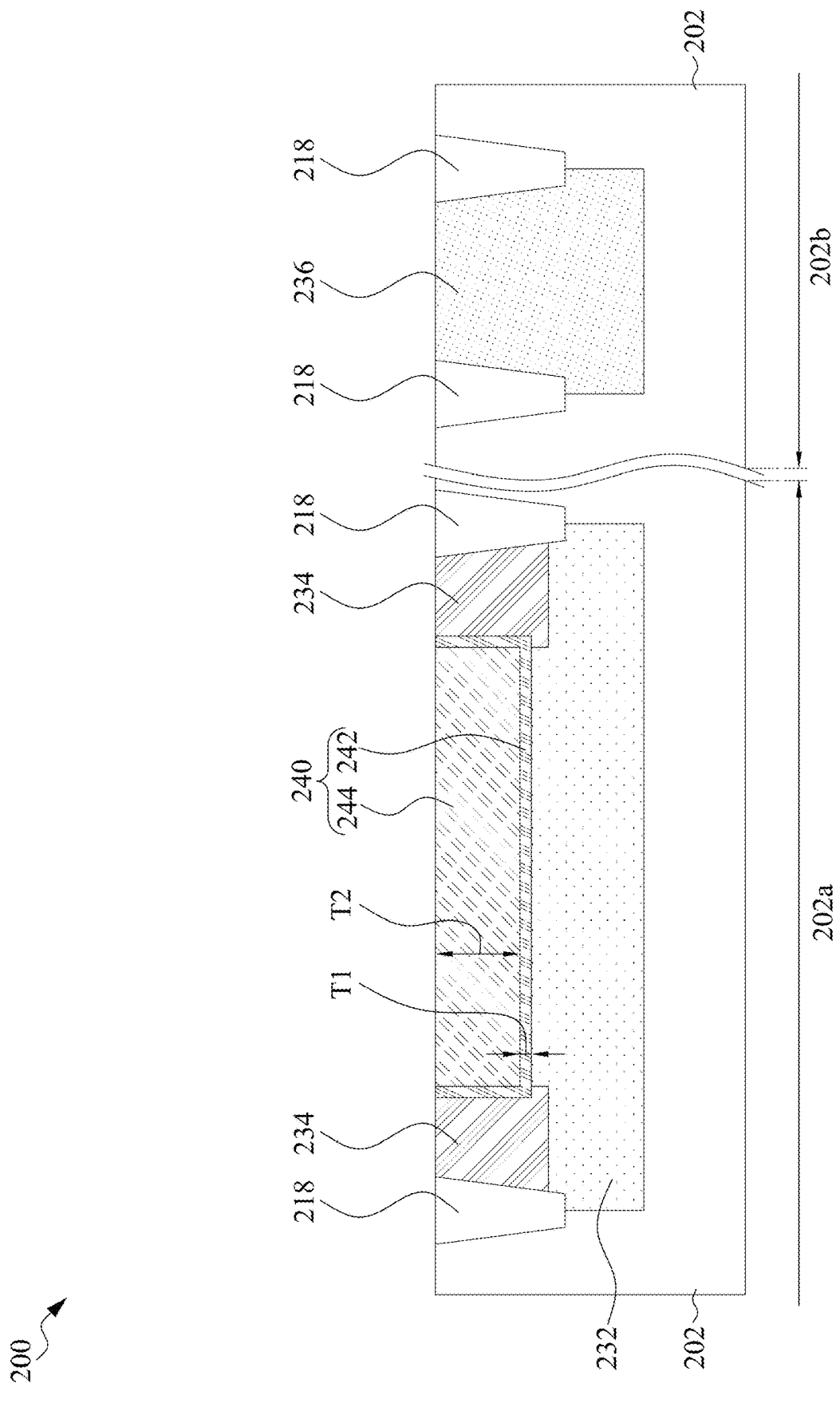

FIGS. 12 through 14 illustrate the formation of a gate structure 240 in the first device region 202a. The gate structure 240 may include a gate dielectric 242 and a gate electrode 244. The respective step is shown as operations 106 and 108 of the method 100 shown in FIG. 1. Referring to FIG. 12, a gate dielectric layer 242' is formed over the substrate 202. In some embodiments, the gate dielectric layer 242' is formed over the substrate 202 in a conformal manner. The gate dielectric layer 242' may be deposited within the recess 224. In some embodiments, the gate dielectric layer 242' is formed to cover the sidewalls and the bottom of the recess 224. The thickness T1 of the gate dielectric layer 242' may be configured based on different requirements for different semiconductor devices. For example, when the gate dielectric 242 to be formed is used as an HV MOS device or an MV MOS device, the thickness T1 of the gate dielectric 242 is substantially in a range from about 100 angstroms (Å) to about 200 angstroms.

Referring to FIG. 13, a gate electrode layer 244' is formed over the substrate 202. In some embodiments, the gate electrode layer 244' is formed over the substrate 202 in a gap-filling manner. The gate electrode layer 244' fills the recess 224. The remaining portions of the recess 224 left by the gate dielectric layer 242' may be filled with the gate electrode layer 244'. The gate electrode layer 244' is formed from conductive material(s). In some embodiments, the gate electrode layer 244' includes undoped polycrystalline silicon. In alternative embodiments, the gate electrode layer 244' is formed with doped semiconductive material e.g., doped polycrystalline silicon, or other suitable conductive materials e.g., metal.

Referring to FIG. 14, a planarization such as CMP is then performed to remove excess portions of the gate dielectric layer 242' and the gate electrode layer 244' over the top surface of the substrate 202 and the top surface of the isolation structures 218. The remaining portions of the gate dielectric layer 242' and the gate electrode layer 244' form a gate structure 240. The gate structure 240 includes the gate dielectric 242 and the gate electrode 244. The gate electrode 244 is disposed within the substrate 202. The gate dielectric 242 is disposed within the substrate 202 and laterally surrounds the gate electrode 244. As shown in FIG. 14, the bottom surface of the gate structure 240 may be higher than the bottom surfaces of the isolation structures 218. In alternative embodiments, the bottom surface of the gate structure 240 is level with the bottom surfaces of the isolation structures 218. The thickness T2 of the gate electrode 244 may be configured based on different requirements for different semiconductor devices. For example, when the gate electrode 244 is used as an HV MOS device or an MV MOS device, the thickness T2 of the gate electrode 244 is substantially in a range from about 700 angstroms (Å) to about 1,000 angstroms.

Figure 15:
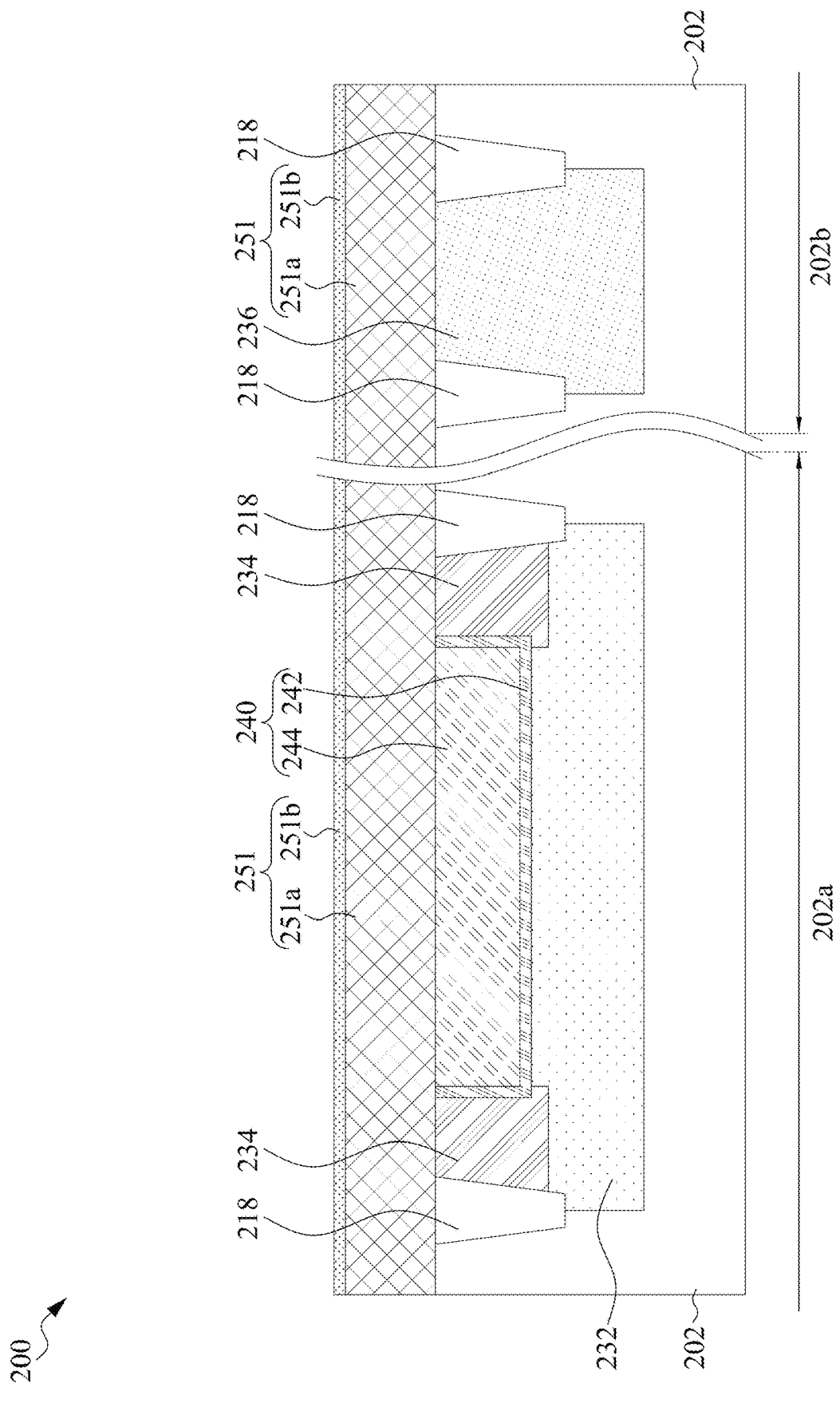
Figure 16:
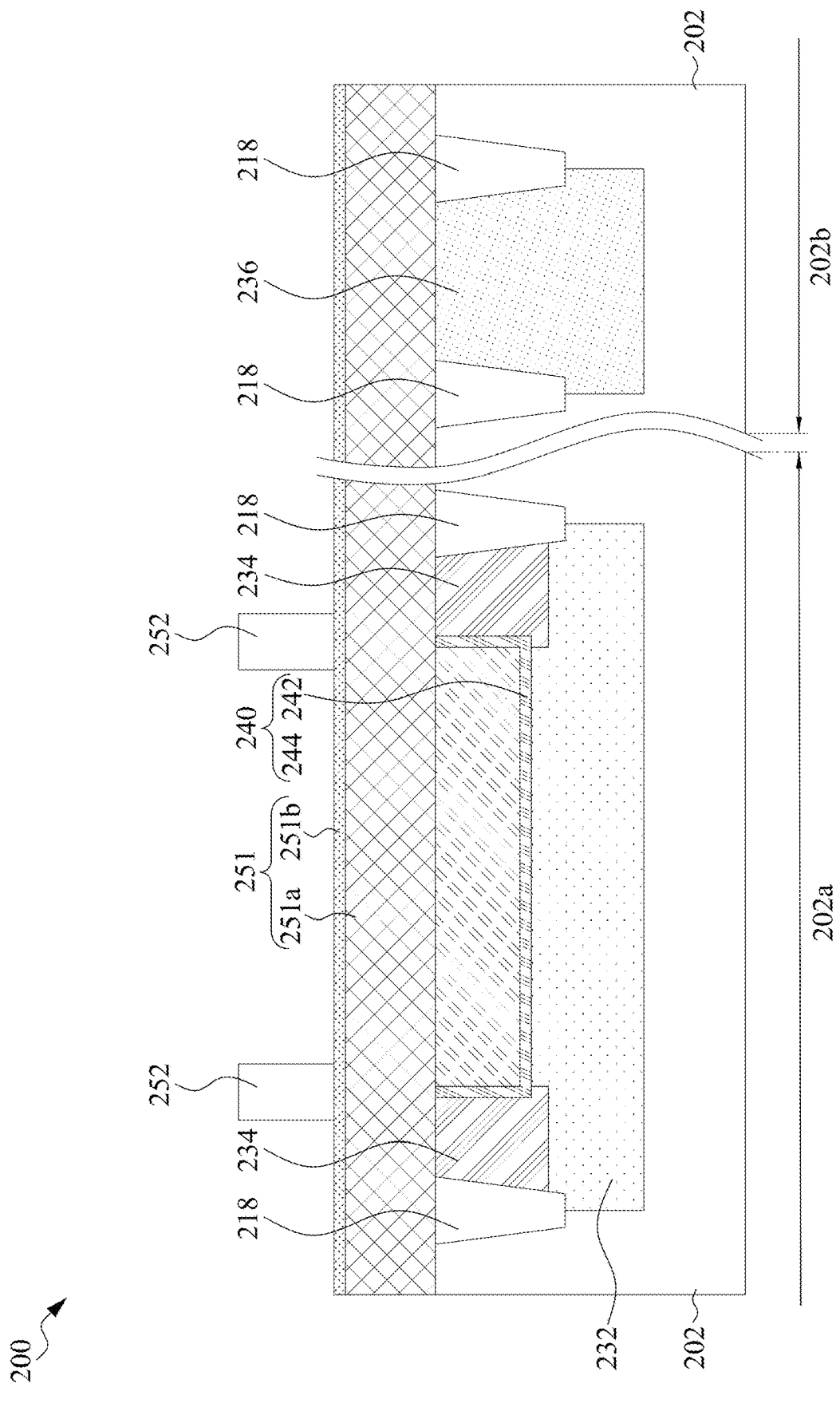
Figure 17:
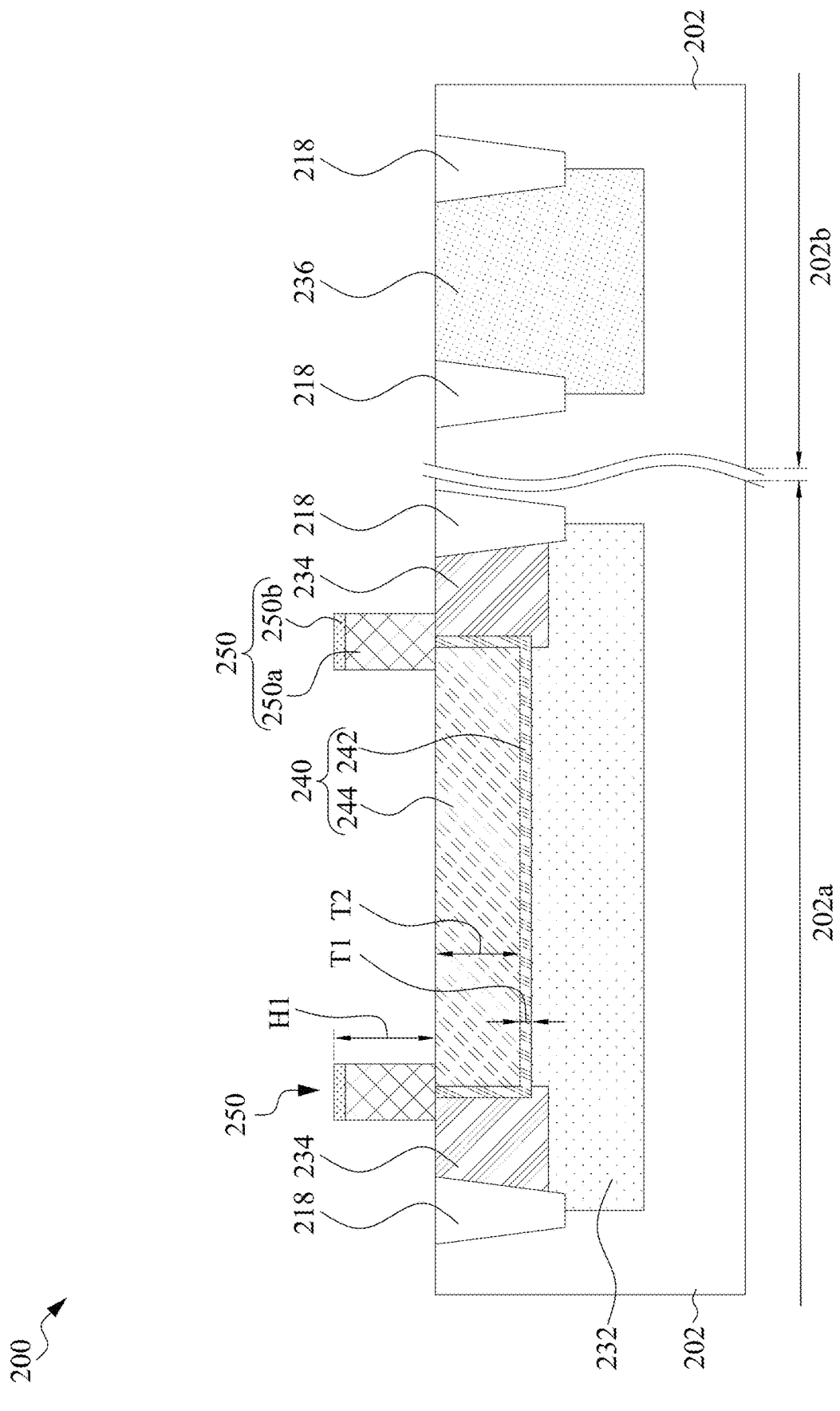

FIGS. 15 through 17 illustrate the formation of a protection structure 250. The respective step is shown as operation 110 of the method 100 shown in FIG. 1. Referring to FIG. 15, a protection layer 251 is formed over the substrate 202. The protection layer 251 may cover the top surface of the gate structure 240, e.g., the top surface of the gate electrode 244 and/or the top surface of the gate dielectric 242. In some embodiments, the protection layer 251 further covers the top surface of the shallow doped regions 234, the top surfaces of the isolation structures 218, and the top surface of the deep well region 236.

The protection layer 251 may include a monolayer structure or a multilayer structure. The formation of the protection layer 251 may include depositing blanket dielectric layers. For example, the protection layer 251 may be a bi-layered structure as shown in FIGS. 15 and 16, but the disclosure is not limited thereto. In some embodiments, the bi-layered protection layer 251 may include a first dielectric layer 251a and a second dielectric layer 251b. In some embodiments, the first and second dielectric layers 251a and 251b include high-k dielectric materials having a high dielectric constant, for example, greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride ($HfO_xN_y$), other suitable metal-oxides, or combinations thereof. The first and second dielectric layers 251a and 251b may include different high-k dielectric materials.

The first dielectric layer 251a and the second dielectric layer 251b may include different materials. For example, the first dielectric layer 251a may be an oxide layer, while the second dielectric layer 251b may be a nitride layer. In some embodiments, the first dielectric layer 251a is formed of silicon oxide, while the second dielectric layer 251b is formed of silicon nitride. In some embodiments, the first dielectric layer 251a is formed, for example, using LPCVD, thermal oxidation of silicon, PECVD, or plasma anodic oxidation. In some embodiments, the formation of the second dielectric layer 251b is formed, for example, using LPCVD, thermal nitridation of silicon, PECVD, or plasma anodic nitridation.

Referring to FIG. 16, a photo resist layer 252 is formed over the protection layer 251 and is then patterned to form openings exposing portions of the protection layer 251.

Referring to FIG. 17, the exposed portions of the protection layer 251 are etched through the openings of the photo resist layer 252. The remaining portion of the patterned photo resist layer is used as an etching mask of the etching operation. The photo resist layer 252 is then removed, and the remaining portions of the protection layer 251 form the protection structure 250. The protection structure 250 may cover a portion of the top surface of the gate dielectric 242, a portion of the top surface of the gate electrode 244 and a portion of the top surface of the shallow doped region 234. The protection structure 250 may include a first protection layer 250a formed from the remaining portions of the first dielectric layer 251a, and a second protection layer 250b formed from the remaining portions of the second dielectric layer 251b. The protection structure 250 has a height H1. The height H1 of the protection structure 250 may be configured based on different requirements for different semiconductor devices. For example, the height H1 of the protection structure 250 may be configured based on the height of the second-voltage device 210b to be formed in the second device region 202b. In some embodiments, the height H1 of the protection structure 250 is in a range from about 300 angstroms (Å) to about 500 angstroms.

Figure 18:
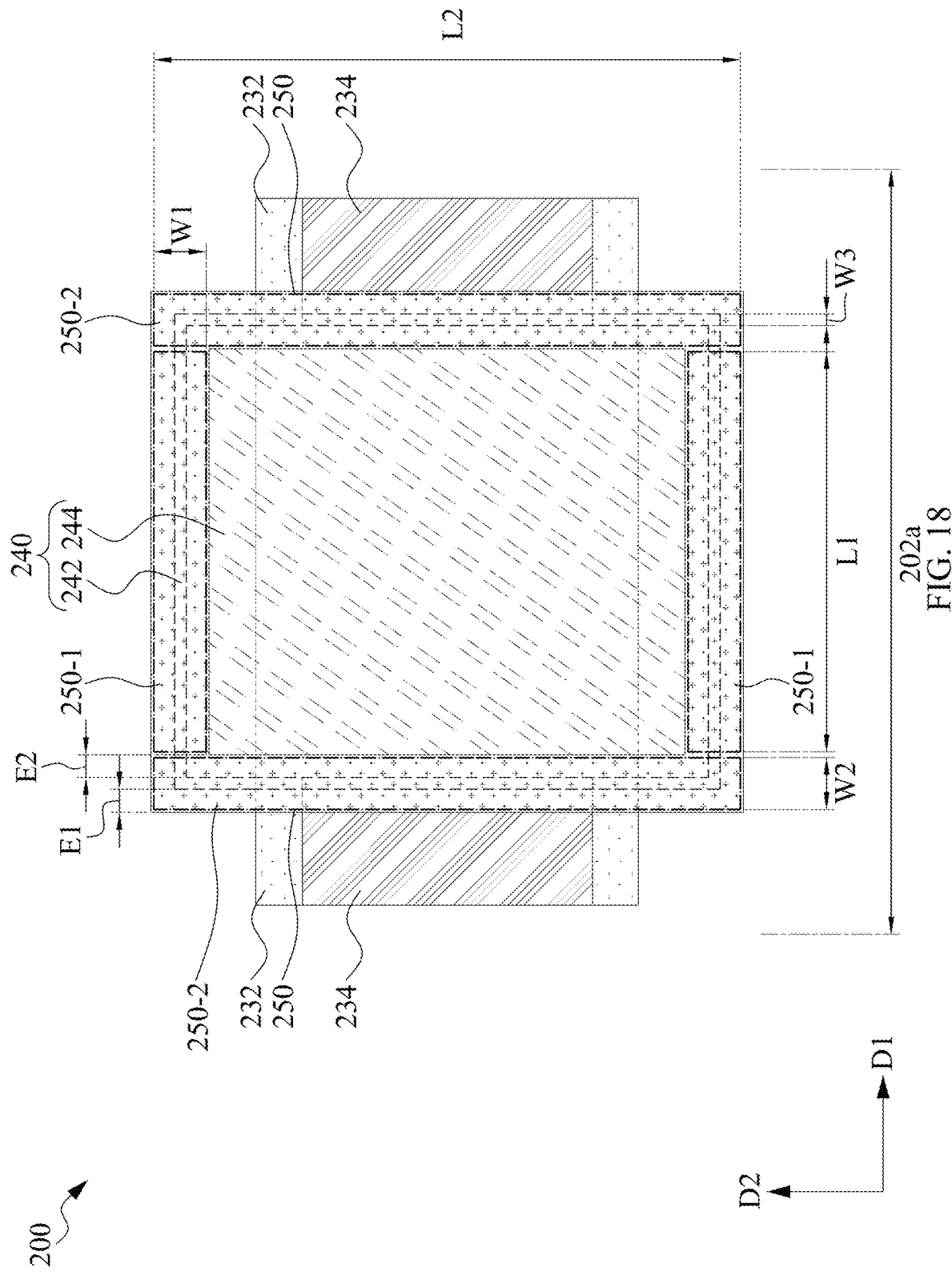

FIG. 18 illustrates a top view of the protection structure 250, the gate structure 240, the deep well region 232 and the shallow doped regions 234 shown in FIG. 17, in accordance with some embodiments of the present disclosure. The deep well region 232 extends in a first direction D1 within the substrate 202. In some embodiments, the gate structure 240 overlaps the deep well region 232 and extends in a second direction D2 different from the first direction D1. The second direction D2 may be perpendicular to the first direction D1.

As shown in FIG. 18, the protection structure 250 overlaps the top surface of the gate dielectric 242 in a top-view perspective. In some embodiments, the protection structure 250 overlaps the entire top surface of the gate dielectric 242. For example, the protection structure 250 may be in a ring shape overlapping the entire top surface of the gate dielectric 242. The protection structure 250 may have two first portions 250-1 extending in the first direction D1 and two second portions 250-2 extending in the second direction D2. The two first portions 250-1 and the two second portions 250-2 form the ring of the protection structure 250. In alternative embodiments, the protection structure 250 overlaps only a portion of the top surface of the gate dielectric 242. For example, the protection structure 250 includes only two second portions 250-2. In some embodiments, a width W1 of the first portion 250-1 is substantially same as a width W2 of the second portion 250-2. In some embodiments, a length L1 of the first portion 250-1 is less than a length L2 of the second portion 250-2.

In some embodiments, the width W1 (or W2) of the protection structure 250 is greater than a width W3 (equal to thickness T1) of the gate dielectric 242. In some embodiments, the width W1 (or W2) is greater than 0.25 μm. The protection structure 250 may further have an extension width E1 overlapping a portion of the top surface of the shallow doped region 234 and a portion of the top surface of the deep well region 232. In some embodiments, the extension width E1 is greater than 0.125 μm. The protection structure 250 may further have an extension width E2 overlapping a portion of the top surface of the gate electrode 244. In some embodiments, the extension width E2 is less than or substantially equal to the extension width E1. In some embodiments, the extension width E2 may be greater than 0.125 μm. The width W1, the width W2, the width W3, the length L1, the length L2, the extension width E1 and the extension width E2 may be configured based on different requirements for different semiconductor devices.

Figure 19:
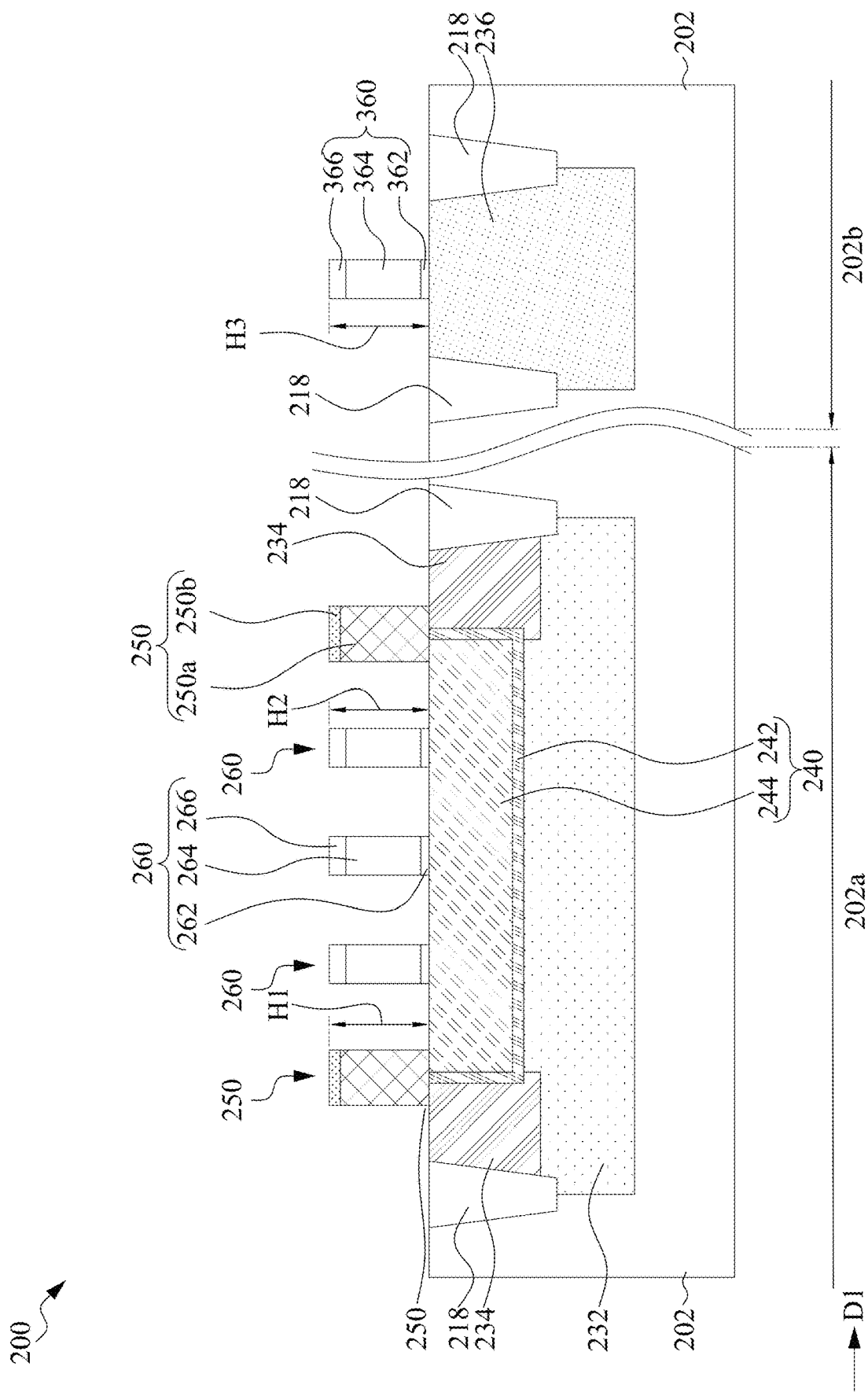

Referring to FIG. 19, gate stacks 260 and 360 are formed in the first device region 202a and the second device region 202b, respectively. The respective step is shown as operation 112 of the method 100 shown in FIG. 1. The gate stacks 260 and 360 may be removed in subsequent steps and replaced by their respective replacement gates. Accordingly, the gate stacks 260 and 360 are referred to as dummy gates in accordance with some embodiments. Each of the gate stacks 260 includes a gate dielectric 262 and a gate electrode 264 over the respective gate dielectric 262. Each of the gate stacks 360 includes a gate dielectric 362 and a gate electrode 364 over the respective gate dielectric 362. The gate dielectrics 262 and 362 may be formed of silicon oxide, silicon nitride, silicon carbide, or the like. The gate electrodes 264 and 364 may include conductive materials. The gate electrodes 264 and 364 are conductive layers. The gate electrodes 264 and 364 may include polysilicon in accordance with some embodiments. The gate electrodes 264 and 364 may also be formed of other conductive materials such as metals, metal alloys, metal silicides, metal nitrides, and/or the like. In some embodiments, each of the gate stacks 260 and 360 further include a hard mask 266 and a hard mask 366, respectively. The hard masks 266 and 366 may be formed of silicon nitride, for example, while other materials such as silicon carbide, silicon oxynitride, and the like may also be used. In accordance with alternative embodiments, the hard masks 266 and 366 are not formed.

In some embodiments, the top surfaces of the gate stacks 260 formed over the gate electrode 244 of the gate structure 240 are substantially level with the top surfaces of the gate stacks 360 formed in the second device region 202b. The gate stack 260 may have a height H2 substantially equal to a height H3 of the gate stack 360. In some embodiments, the height H1 of the protection structure 250 is substantially same as the height H2 of the gate stack 260 or the height H3 of the gate stack 360. The height H1 of the protection structure 250 may be configured based on the height H2 of the gate stack 260 or the height H3 of the gate stack 360. In some embodiments, the height H2 of the gate stack 260 is in a range from about 300 angstroms (Å) to about 500 angstroms. In some embodiments, the height H3 of the gate stack 360 is in a range from about 300 angstroms (Å) to about 500 angstroms. In some embodiments, the gate stacks 260 and 360 may be formed during a same formation process, and thus have the same height, and are formed of the same materials.

Figure 20:
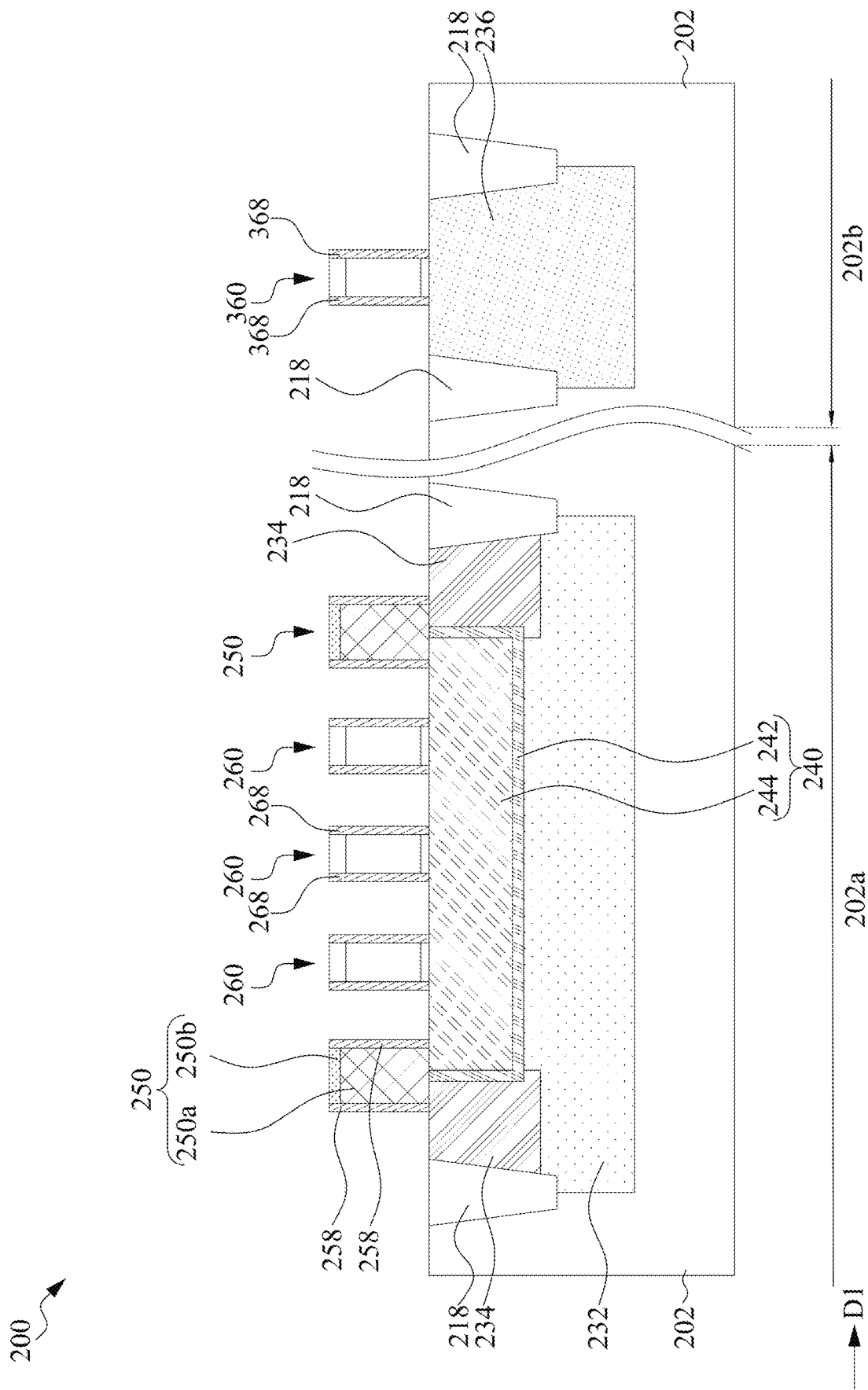

Referring to FIG. 20, gate spacers 268 and 368 are formed on the sidewalls of each of the respective gate stacks 260 and 360. In some embodiments, gate spacers 258 are also formed on sidewalls of the protection structure 250. In accordance with some embodiments, each of the gate spacers 258, 268 and 368 includes a silicon oxide layer and a silicon nitride layer on the silicon oxide layer. The formation may include depositing blanket dielectric layers, and then performing an anisotropic etching to remove the horizontal portions of the blanket dielectric layers. The available deposition methods include PECVD, LPCVD, sub-atmospheric chemical vapor deposition (SACVD), and other deposition methods. In some embodiments, the gate spacers 258, 268 and 36 may be formed during a same formation process, and thus are formed of the same materials.

Figure 21:
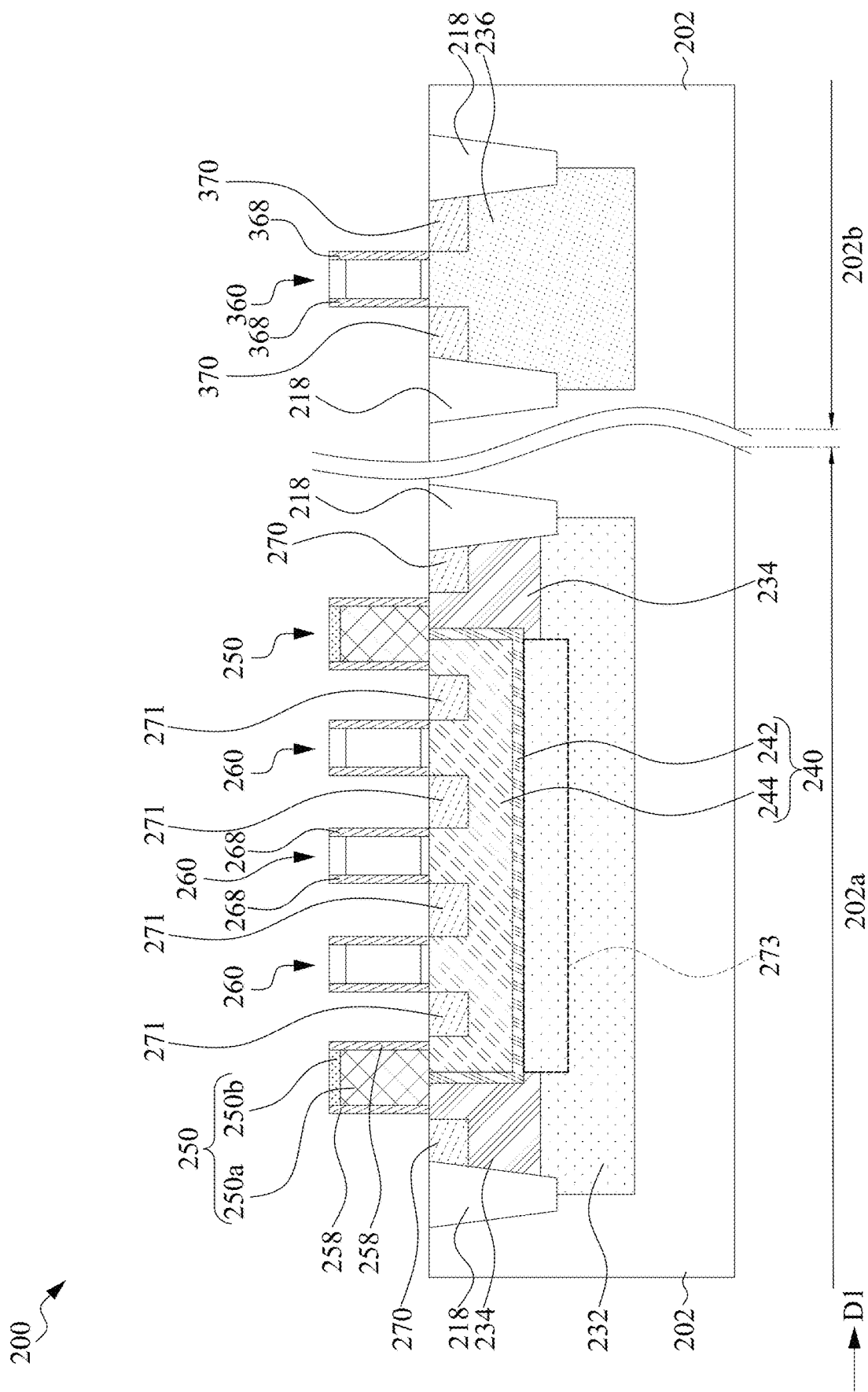

Referring to FIG. 21, source regions and drain regions (collectively referred to as source/drain regions hereinafter) 270 and 370 are formed in the first device region 202a and the second device region 202b. Further, doped regions 271 may be formed in the first device region 202a. In addition, the source/drain regions 270 and 370, and the doped regions 271 may be formed in a single formation process, and thus have the same depth, and are formed of the same materials.

Referring to the first device region 202a, the source/drain regions 270 may be formed in the shallow doped regions 234, and doped regions 271 may be formed in the gate electrode 244. One of the source/drain regions 270 formed in the shallow doped regions 234 serves as the source region, and the other one of the source/drain regions 270 formed in the shallow doped regions 234 serves as the drain region. A channel 273 is formed directly underlying the gate dielectric 242 for conducting current between the source/drain regions 270. The channel 273 may be formed in the upper portion of the deep well region 232. The doped regions 271 formed in the gate electrode 244 may serve as a doped region 272 (see FIG. 22) of the gate electrode 244. Referring to the second device region 202b, the source/drain regions 370 are formed in the deep well region 236.

The source/drain regions 270 and 370, and the doped regions 271 may be formed simultaneously in a same implantation process. In some embodiments, the source/drain regions 270 and 370, and the doped regions 271 are of n-type, and are heavily doped, and thus are referred to as N+ regions. In some embodiments, a photo resist (not shown) is formed over the substrate 202 to define the location of the source/drain regions 270 and 370, and the doped regions 271. The source/drain regions 270 may be spaced apart from the gate dielectric 242 by the protection structure 250. Further, the source/drain regions 270 and 370 may have edges aligned to the edges of the gate spacers 258 and 368, respectively. The doped regions 271 may have edges aligned to the edges of the gate spacers 268. Further, a portion of the doped regions 271 may have edges aligned to the edges of the gate spacers 258.

Figure 22:
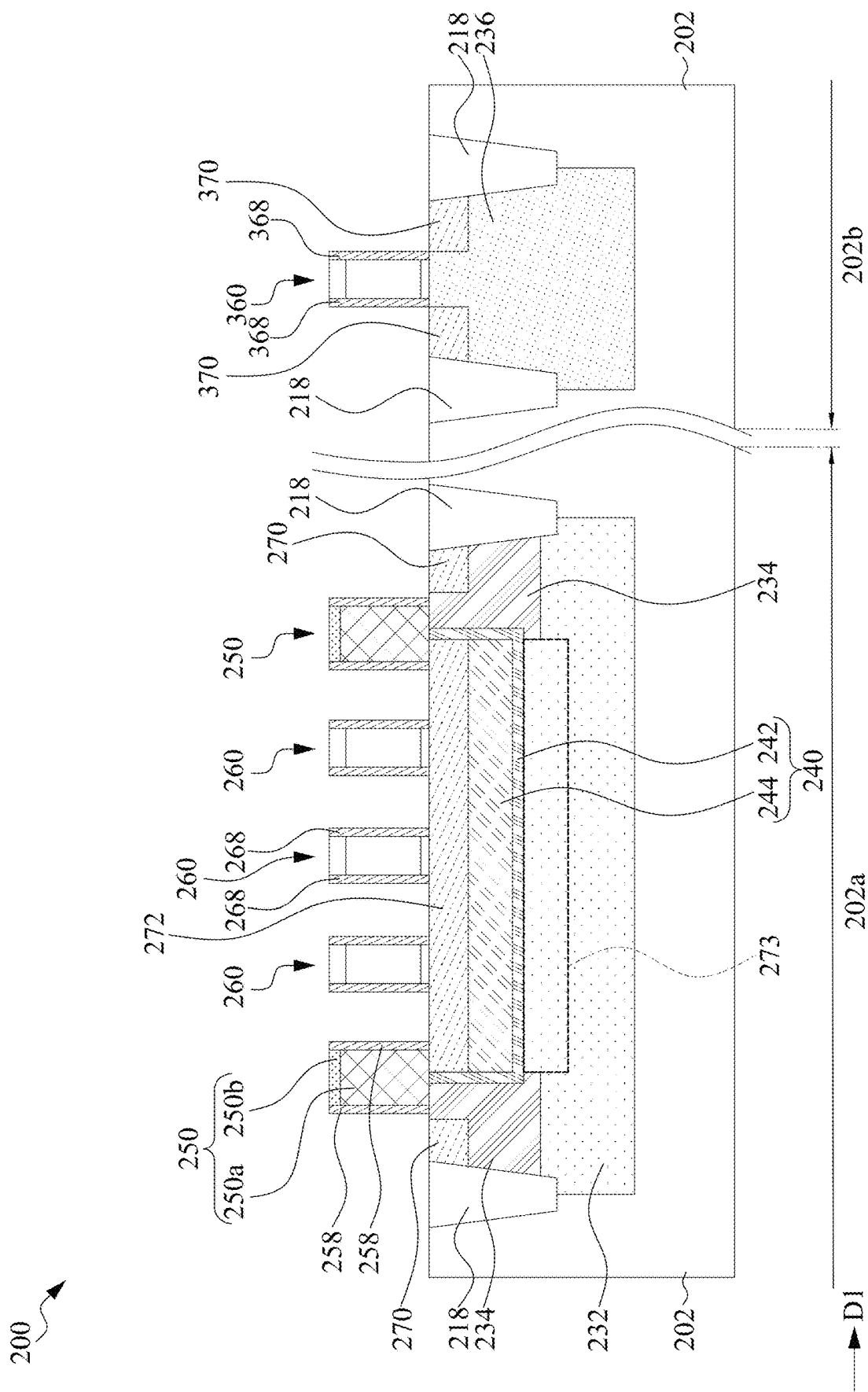

Referring to FIG. 22, an annealing operation may be performed. The annealing operation may include annealing the structure shown in FIG. 21 at an elevated temperature. The annealing operation may facilitate activation and diffusion of the dopants in the doped regions 271 formed in the gate electrode 244, resulting a continuous doped region 272 of the gate electrode 244. The doped region 272 may be disposed in an upper portion of the gate electrode 244. The presence of the doped region 272 may help alleviating the polysilicon depletion effect of the gate electrode 244. Unlike the general polysilicon pre-doping approaches, where a polysilicon gate electrode is doped directly after the formation of the polysilicon gate electrode with separate photolithography operations, the doped region 272 is formed along with the formation of the source/drain regions 270 and 370. Hence, the manufacturing operations can be simplified, and the production cost can be reduced.

Figure 23:
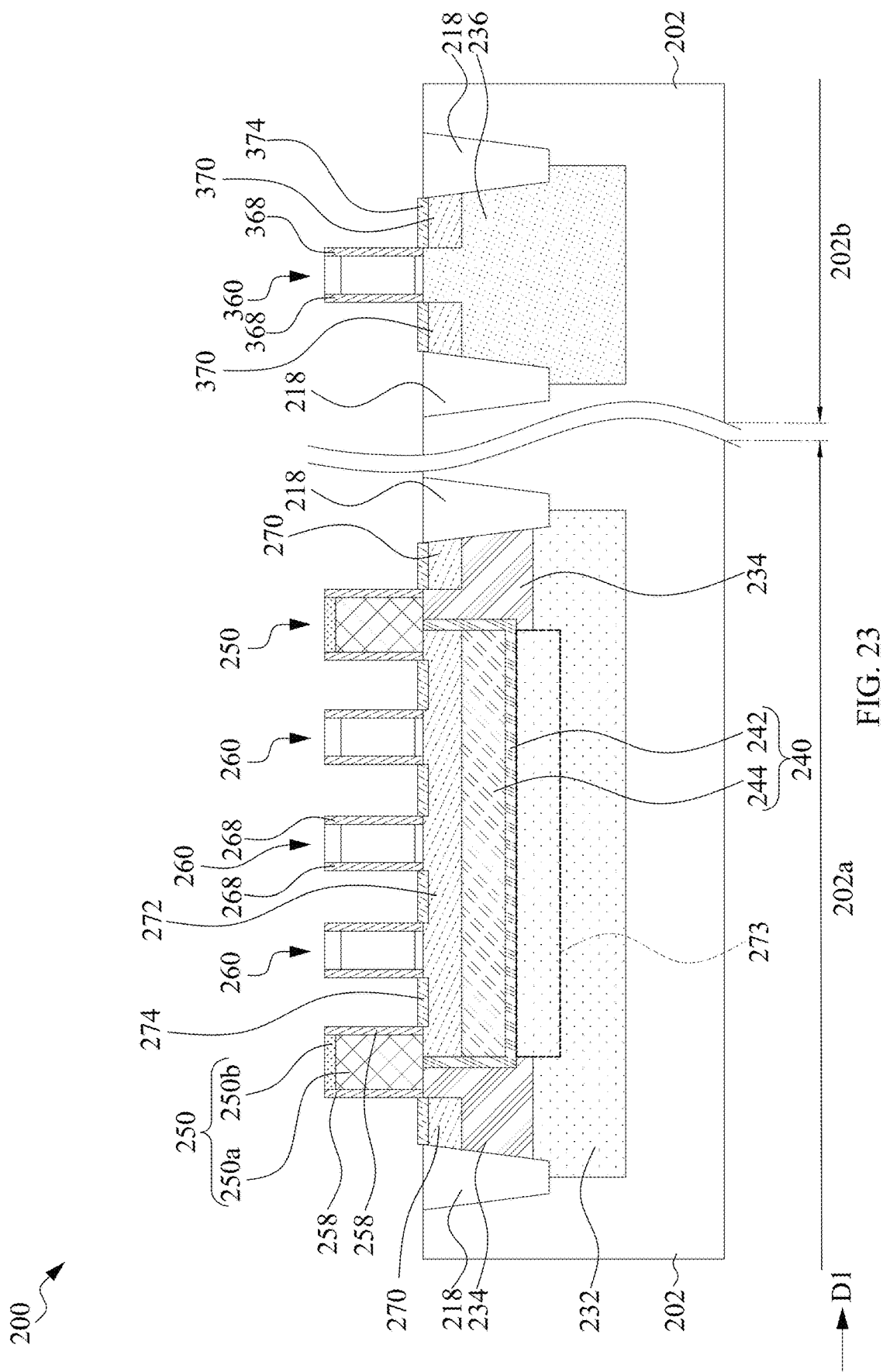

Referring to FIG. 23, silicide regions 274 and 374 are formed in the first device region 202a and the second device region 202b, respectively. The formation process may include forming a resist protective oxide (RPO) over portions of the substrate 202 that are not protected by the gate spacers 258, 268 and 368, and the protection structure 250. The RPO may function as a silicide blocking layer during the formation of the silicide regions 274 and 374. The silicide regions 274 and 374 may be formed using silicidation such as self-aligned silicide (salicide), in which a metallic material is formed over the substrate 202, the temperature is raised to anneal the substrate 202 and cause reaction between underlying silicon of the substrate 202 and the metal to form silicide, and un-reacted metal is etched away. The silicide regions 274 and 374 may be formed in a self-aligned manner on various features, such as the source/drain regions 270 and 370 and/or the doped region 272 of the gate electrode 244, to reduce contact resistance at the interface between these features and the conductive components subsequently formed on the silicide regions 274 or 374.

Figure 24:
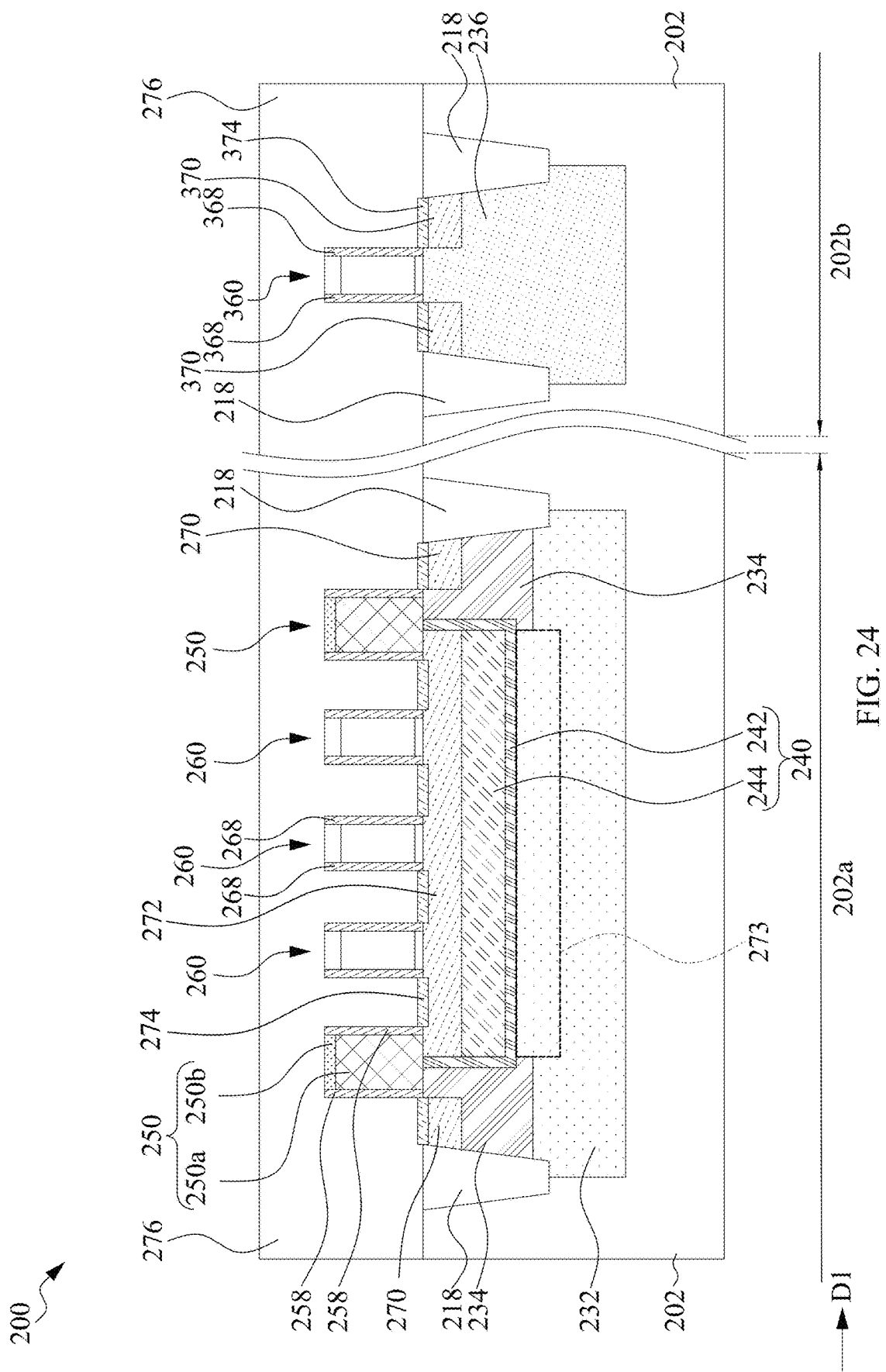

Referring to FIG. 24, an inter-layer dielectric (ILD) layer 276 is formed over the substrate 202. The ILD layer 276 is blanket formed to a height higher than the top surfaces of the gate stacks 260 and 360. The ILD layer 276 is blanket formed to a height higher than the top surfaces of the protection structure 250. The ILD layer 276 may be formed of an oxide using, for example, flowable chemical vapor deposition (FCVD). The ILD layer 276 may also be a spin-on glass formed using spin-on coating. For example, the ILD layer 276 may be formed of phospho-silicate glass (PSG), boro-silicate glass (BSG), boron-doped phospho-silicate glass (BPSG), tetraethyl orthosilicate (TEOS) oxide, TIN, SiOC, or other low-k dielectric materials.

Figure 25:
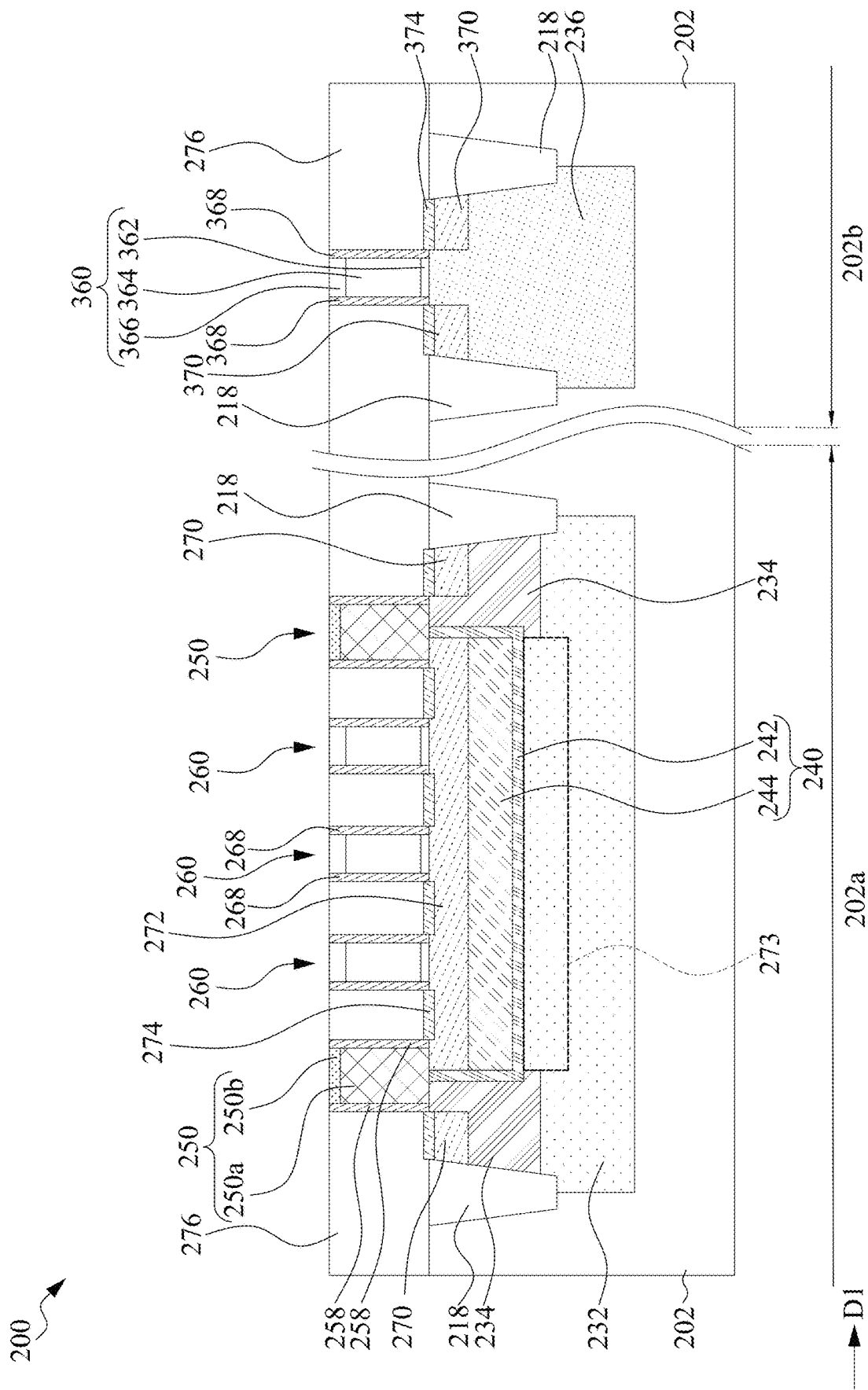

Referring to FIG. 25, FIG. 25 illustrates a planarization step, which is performed using, for example, CMP. The CMP is performed to remove excess portions of the ILD layer 276, until the gate stack 360 is exposed. Since the top surfaces of the gate stacks 260 are level with the top surface of the gate stack 360, the gate stacks 260 are also exposed from the ILD layer 276, after the planarization step. Further, the top surface of the protection structure 250 is also level with the top surface of the gate stack 360, the protection structure 250 is also exposed from the ILD layer 276, after the planarization step. The planarization may be stopped on the hard masks 266 and 366, if they are present. The planarization may be stopped on the second protection layer 250b, if it is present. Alternatively, the hard masks 266 and 366 are removed in the planarization, and the gate electrodes 264 and 364 are exposed. Alternatively, the second protection layer 250b is removed in the planarization, and the first protection layer 250a is exposed.

The gate stacks 260 may serve as stop layers for keeping the ILD layer 276 from being over-etched during the CMP operation. The protection structure 250 may also serve as another stop layer for keeping the ILD layer 276 from being over-etched during the CMP operation. The gate stacks 260 and the protection structure 250 may prevent unwanted dishing from occurring in the first device region 202a. Accordingly, by reducing the dishing effect, the performance of the first-voltage devices 210a may be improved and the cost of manufacturing may be reduced.

Figure 26:
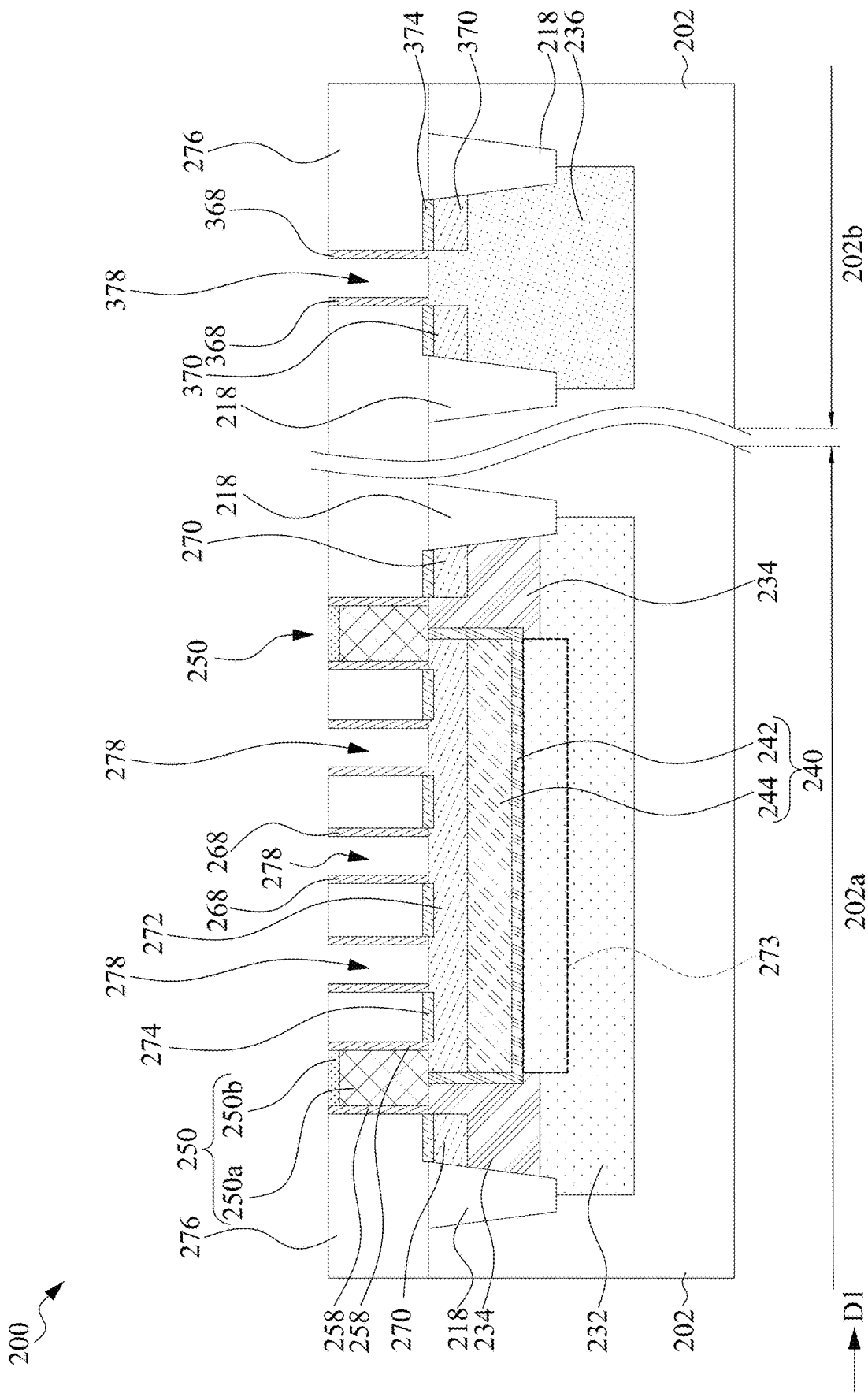
Figure 27:
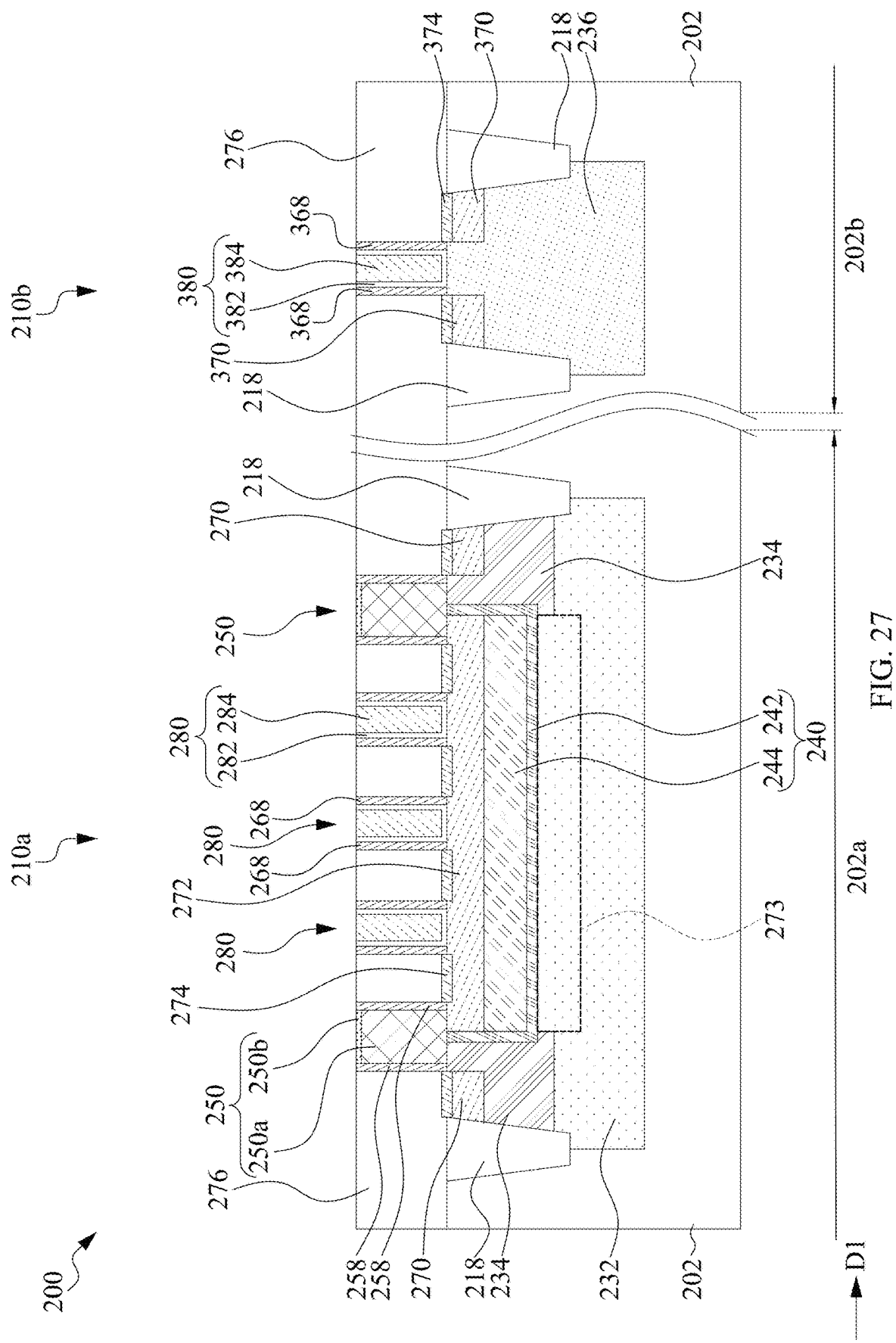

FIGS. 26 and 27 illustrate the formation of replacement gate stacks 280 and 380 in accordance with some embodiments. Referring to FIG. 25, the gate stacks 260 and 360 (FIG. 25) are removed. In some embodiments, the gate stacks 260 and 360 are removed to form gate trenches 278 and 378, respectively, in the ILD layer 276. In some embodiments, a dry etching operation is performed to remove the gate stacks 260 and 360. In some embodiments, the dry etching operation uses F-containing plasma, Cl-containing plasma and/or Br-containing plasma to remove the gate stacks 260 and 360. In some embodiments, the protection structure 250 remains in place during the removal of the gate stacks 260 and 360.

In some embodiments, the substrate 202 may include various device regions, and the various device regions may include various n-type or p-type MOS devices and one or more passive devices such as a resistor. These different devices may be of different types. In some embodiments, when an I/O MOS device is used, the gate dielectrics 262 and 362 (FIG. 25) can respectively serve as an interfacial layer (IL). Thus, the gate dielectrics 262 and 362 may not be removed. In alternative embodiments, when a core MOS device is used, the gate dielectrics 262 and 362 are removed to thereby expose the substrate 202 to the gate trenches 278 and 378, respectively.

Referring to FIG. 27, the gate stacks 260 and 360 (FIG. 25) are replaced by replacement gate stacks 280 and 380, respectively. Each of the gate stacks 280 includes a gate dielectric 282 and a gate electrode 284 arranged over one another. Each of the gate stacks 380 includes a gate dielectric 382 and a gate electrode 384 arranged over one another. The gate dielectrics 282 and 382 may include a high-k dielectric material such as hafnium oxide, lanthanum oxide, aluminum oxide, or the like. In addition, the gate dielectrics 282 and 382 may be formed during a single formation process, and thus have the same thicknesses, and are formed of the same dielectric materials.

The gate electrodes 284 and 384 may include conductive layers. In some embodiments, the gate electrodes 284 and 384 may include at least a barrier metal layer, a work functional metal layer and a gap-filling metal layer. The barrier metal layer may include, for example but not limited to, TiN. The work function metal layer may include a single layer of TiN, TaN, TaAlC, TiC, TaC, Co, Al, TiAl, HfTi, TiSi, TaSi or TiAlC, or a multilayer of two or more of these materials, but is not limited to the above-mentioned materials. In some embodiments, the gap-filling metal layer includes a conductive material such as Al, Cu, AlCu, or W, but is not limited to the above-mentioned materials. The formation methods include PVD, CVD, or the like. In addition, the gate electrodes 284 and 384 may be formed in a single formation process, and are formed of the same dielectric materials.

A planarization operation (for example, a CMP) is then performed to remove excess portions of the gate dielectrics 282 and 382, and gate electrodes 284 and 384, leaving the structure shown in FIG. 27. Referring to the first device region 202a, at least a portion of the protection structure 250 may be removed during the planarization operation. For example, the top portion of the second protection layer 250b of the protection structure 250 may be removed. The height H1 of the protection structure 250 may be reduced. In some embodiments, the protection structure 250 has a reduced height of the protection structure 250 after the planarization operation.

As shown in FIG. 27, the gate dielectric 282 of the gate stacks 280 contacts and overlaps the gate electrode 244, while the protection structure 250 contacts and overlaps the gate dielectric 242. The protection structure 250 may further contact and overlap a portion of the gate electrode 244 and a portion of the shallow doped regions 234. The gate stacks 280 may be electrically connected to the gate structure 240. The gate stacks 280 are separated from each other. The protection structure 250 may be electrically isolated from the gate structure 240. The protection structure 250 is between the gate stacks 280 and the gate stack 360.

In some embodiments, additional gate stacks 360 are formed in the second device region 202b. The gate stacks 280 and the gate stacks 360 may be collectively referred to as a plurality of gate structures of the LV MOS devices. The gate stacks 280 may be referred to as a first subset of the gate structures, while the gate stacks 360 may be referred to as a second subset of the gate structures. The protection structure 250 is located between the gate stacks 280 and the gate stacks 360. Accordingly, the first subset and the second subset are separated by the protection structure 250.

Figure 28:
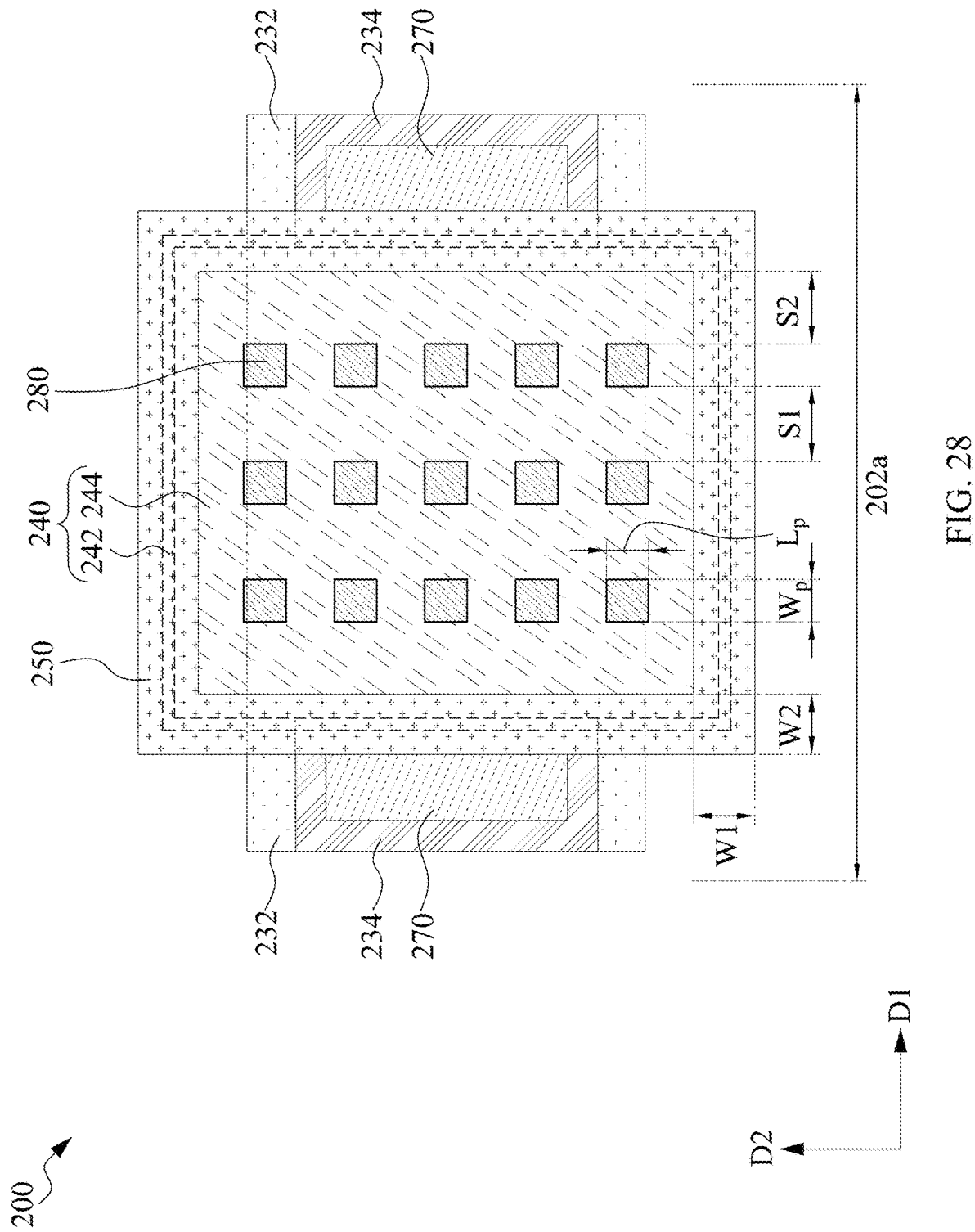

FIG. 28 illustrates a top view of the gate stacks 280, the protection structure 250, the gate structure 240 and the source/drain regions 270 according to aspects of one or more embodiments of the present disclosure. The gate stacks 280 may a width $W_p$ and a length $L_p$. The width $W_p$ and the length $L_p$ may be substantially equal. The width $W_p$ may be in the range between about 0.4 μm and about 1.0 μm in accordance with some embodiments. The gate stacks 280 may have different configurations. In alternative embodiments, the width $W_p$ is different from the length $L_p$. The width $W_p$ may be less than the width W2 or the width W1 of the protection structure 250. In some embodiments, the width $W_p$ is substantially equal to the width W2 (or the width W1). The width $W_p$ and the length $L_p$ may be configured based on different requirements for different semiconductor devices.

A spacing S1 is arranged between two adjacent gate stacks 280. The spacing S1 may be in the range between about 0.4 μm and about 1.0 μm in accordance with some embodiments. The spacing S1 may be greater than the width $W_p$. In some embodiments, a ratio of the width $W_p$ to the spacing S1 is less than 1. A spacing S2 is arranged between the protection structure 250 and the neighboring gate stack 280. In some embodiments, the spacing S2 is less than or substantially equal to the spacing S1. The spacing S1 and the spacing S2 may be configured based on different requirements for different semiconductor devices.

The gate stacks 280 land on the gate electrode 244. Each of the gate stacks 280 overlaps the gate electrode 244. In some embodiments, an area of the gate electrode 244 exposed from the protection structure 250 is defined as X. A total area of the gate stacks 280 overlapping the gate electrode 244 is defined as Y. A ratio Y/X may be in the range between about 50% and about 80% in accordance with some embodiments. The ratio Y/X may be also referred to as a pattern density of the gate stacks 280. In other words, the pattern density of the gate stacks 280 may be in the range between about 50% and about 80%. The pattern density of the gate stacks 280 may be configured based on different requirements for different semiconductor devices.

Based on the operations with reference to FIGS. 27 and 28, an exemplary first-voltage device 210a and an exemplary second-voltage device 210b are thus formed. The first-voltage device 210a includes the gate electrode 244, the gate dielectric 242, and the source/drain regions 270. The second-voltage device 210b includes the gate electrode 384, the gate dielectric 382, and the source/drain regions 370. The gate stacks 280 formed over the first-voltage device 210a may serve as protection structures. For example, the gate stacks 280 may serve as protection structures for protecting the underlying gate structure 240 during the planarization of the ILD layer 276. The protection structure 250 encircles the gate stacks 280 from a top-view perspective. The protection structure 250 may serve as another protection structure for protecting the underlying gate dielectric 242 during the planarization of the ILD layer 276. The protection structure 250 may further serve as spacers for the gate structure 240.

In accordance with some embodiments, the first-voltage device 210a is an MV MOS device or a HV MOS device, while the second-voltage device 210b is a LV MOS device. In some embodiments, the thickness of the gate dielectric 382 (and 282) is selected to match the operating voltage of the second-voltage device 210b. The gate dielectric 242 of the first-voltage device 210a is thick enough to sustain the medium voltages or high voltages. The thickness of the gate dielectric 382 (and 282) is thinner than the thickness of the gate dielectric 242.

The proposed structures provide advantages. In cases where the gate stacks 280 and the protection structure 250 are otherwise absent, the gate dielectric 242 and the gate electrode 244 may directly contact the ILD layer 276. When a planarization process is performed on the ILD layer 276, the planarization process will remove portions of the ILD layer 276 to expose underlying features of the gate stack 360 for subsequent processing (e.g., etching for the formation of replacement gate stack 380). However, due to the various types of features formed in the level of the ILD layer 276 (e.g., dielectric, metal, polysilicon, etc.), the planarization process may cause dishing in the ILD layer 276 (as the various materials are removed at different rates during the planarization process). In some severe instances, the dishing may cause improperly removal of the underlying gate electrode 244 or the gate dielectric 242. Also, the dishing effect may affect the area of the channel 273 of the first-voltage device 210a. For example, in cases where the gate stacks 280 and the protection structure 250 are otherwise absent, the area of the channel 273 of the first-voltage device 210a may be reduced to, e.g., about 20 µm times 20 µm, which may not meet high design requirements.

The presence of the gate stacks 280 and the protection structure 250 may provide structural support during the planarization process. The presence of the gate stacks 280 and the protection structure 250 may mitigate the extent of dishing in the ILD layer 276. Moreover, due to the structural support of the gate stacks 280 and the protection structure 250, the channel dimensions of the first-voltage device 210a may be increased. In some embodiments, the area of the channel 273 of the first-voltage device 210a may be increased, e.g., to about 200 µm times 200 µm, but the present disclosure is not limited thereto. Further, the presence of the protection structure 250 may serve as an additional spacer, in addition to the gate spacer 258, between the gate dielectric 242 and the source/drain regions 270.

Figure 29:
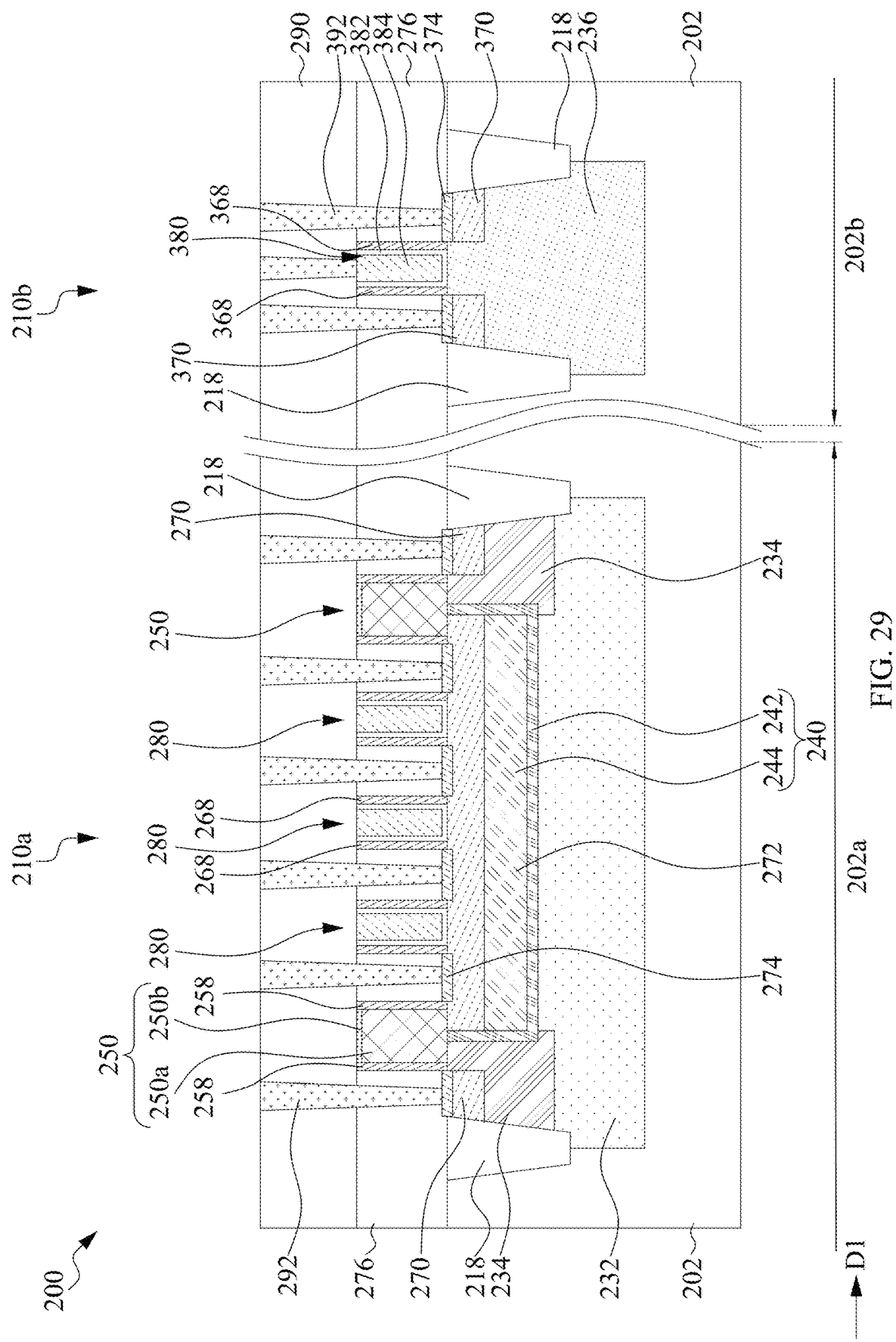

FIG. 29 illustrates the formation of a dielectric layer 290 over replacement gate stacks 280 and 380. The dielectric layer 290 may be formed of a material selected from the same candidate materials for forming the ILD layer 276. The materials of the ILD layer 276 and the dielectric layer 290 may be the same or different from each other.

Referring to FIG. 29, contact plugs 292 and 392 are formed in the dielectric layer 290 and the ILD layer 276. The formation process may include forming contact plug openings in the ILD layer 276 and the dielectric layer 290 to expose the source/drain regions 270/370, the gate electrode 244 and the gate electrode 384, and filling the contact plug openings to form the contact plugs 292 and 392. In some embodiments, the contact plugs 292 on the gate electrode 244 may be referred to as gate vias of the first-voltage device 210a. In some embodiments, at least one of the contacts plugs 292 on the gate electrode 244 is between two gate stacks 280. In alternative embodiments, the contact plugs 292 in the first device region 202a may be formed over the top surface of the gate stack 280. A bias voltage may thus be supplied through the contact plug 292 and the gate stack 280 to the gate electrode 244.

Figure 30:
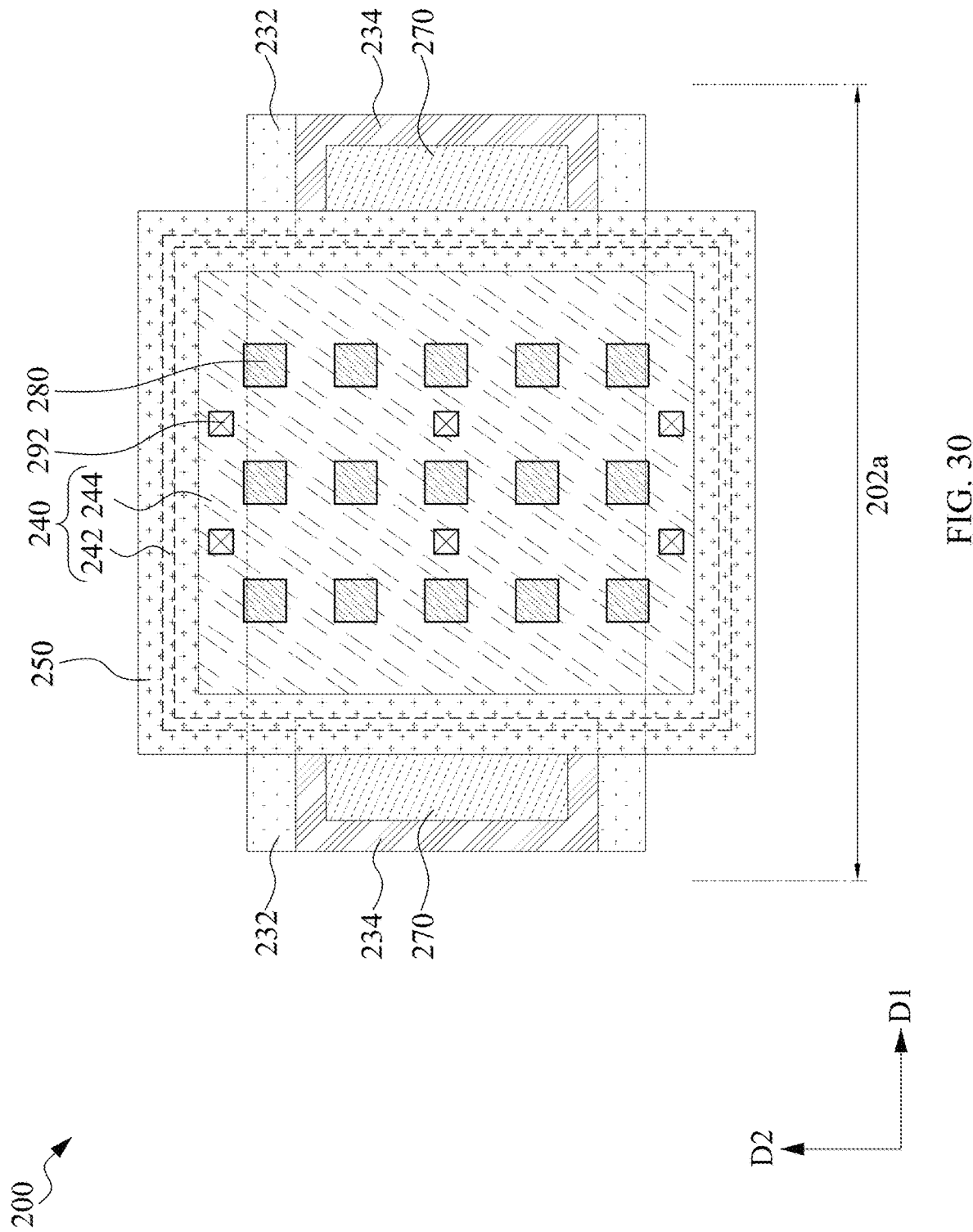

Referring to FIG. 30, FIG. 30 illustrates a top view of the gate stacks 280, the protection structure 250, the gate structure 240, the source/drain regions 270, and the contact plugs 292 according to aspects of one or more embodiments of the present disclosure. The contact plugs 292 land on the gate electrode 244 may be referred to as gate vias of the first-voltage device 210a. In some embodiments, the gate vias 292 may be configured to land on the gate electrode 244 at a location where the gate electrode 244 does not overlap the deep well region 232.

Figure 31:
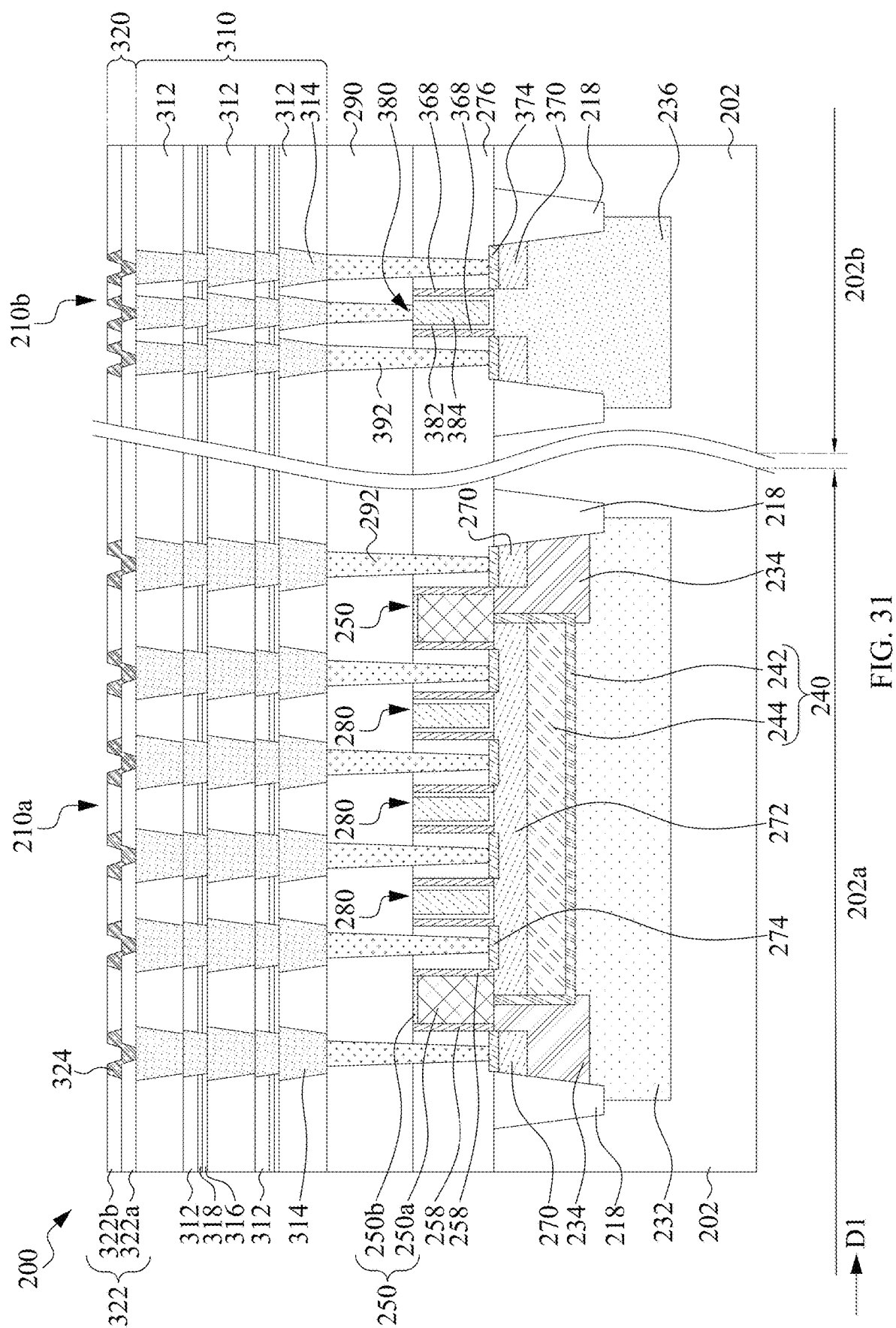
FIG. 31 is a top view of a semiconductor structure, according to aspects of one or more embodiments of the present disclosure.

Referring to FIG. 31, an interconnect structure 310 is arranged over the dielectric layer 290. The interconnect structure 310 may comprise one or more inter-metal dielectric (IMD) layers 312. The IMD layer 312 may comprise, for example, one or more layers of an oxide, a low-k dielectric, or an ultra-low-k dielectric. The IMD layer 312 may surround conductive patterns (including metal wires and metal vias) 314 that comprise, for example, copper, tungsten, and/or aluminum. In some embodiments, the contact plugs 292 are configured to electrically couple the source/drain regions 270 of the first-voltage device 210a to a first conductive pattern 314 of the interconnect structure 310. In some embodiments, the contact plugs 392 are configured to electrically couple the source/drain regions 370 of the second-voltage device 210b to the first conductive pattern 314 of the interconnect structure 310.

The interconnect structure 310 may comprise one or more dielectric layers 316 and 318 disposed between the IMD layers 312. The dielectric layers 316 and 318 may serve as etch stop layers. In some embodiments, the dielectric layers 316 include dielectric materials, such as SiN, SiCN, SiCO, combinations thereof, or the like. In some embodiments, the dielectric layer 316 includes a multilayer structure, e.g., formed of a nitride layer and an oxide layer. In some embodiments, the dielectric layers 318 include silicon nitride, silicon carbide, and the like. In some embodiments, the interconnection structure 310 further includes barrier layers, such as formed of Ta or TaN, between the IMD layers 312 and the conductive patterns 314.

An under-bump metallization (UBM) stack 320 is arranged over the interconnect structure 310. In some embodiments, the UBM stack 320 comprises a passivation layer 322 and a UBM layer 324. In some embodiments, the passivation layer 322 comprises one or more layers of $SiO_2$, silicon nitride ($Si_3N_4$), polyimide compounds, or other suitable materials. The passivation layer 322 may include a single-layered structure or a multiple layered structure. For example, the passivation layer 322 may be a bi-layered structure as shown in FIG. 31, but the disclosure is not limited thereto. In some embodiments, the bi-layered passivation layer 322 may include a first dielectric layer 322a and a second dielectric layer 322b. The UBM layer 324 contacts an upper conductive feature (e.g., a conductive pattern 314) of the interconnect structure 310. The UBM layer 324 may comprise, for example, aluminum, titanium, tungsten, or some other suitable material. The UBM layer 324 is configured to provide an interface between an overlying solder bump (not shown) and an underlying conductive feature (e.g., a conductive pattern 314) of the interconnect structure 310.

The structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be repeated.

Figure 32:
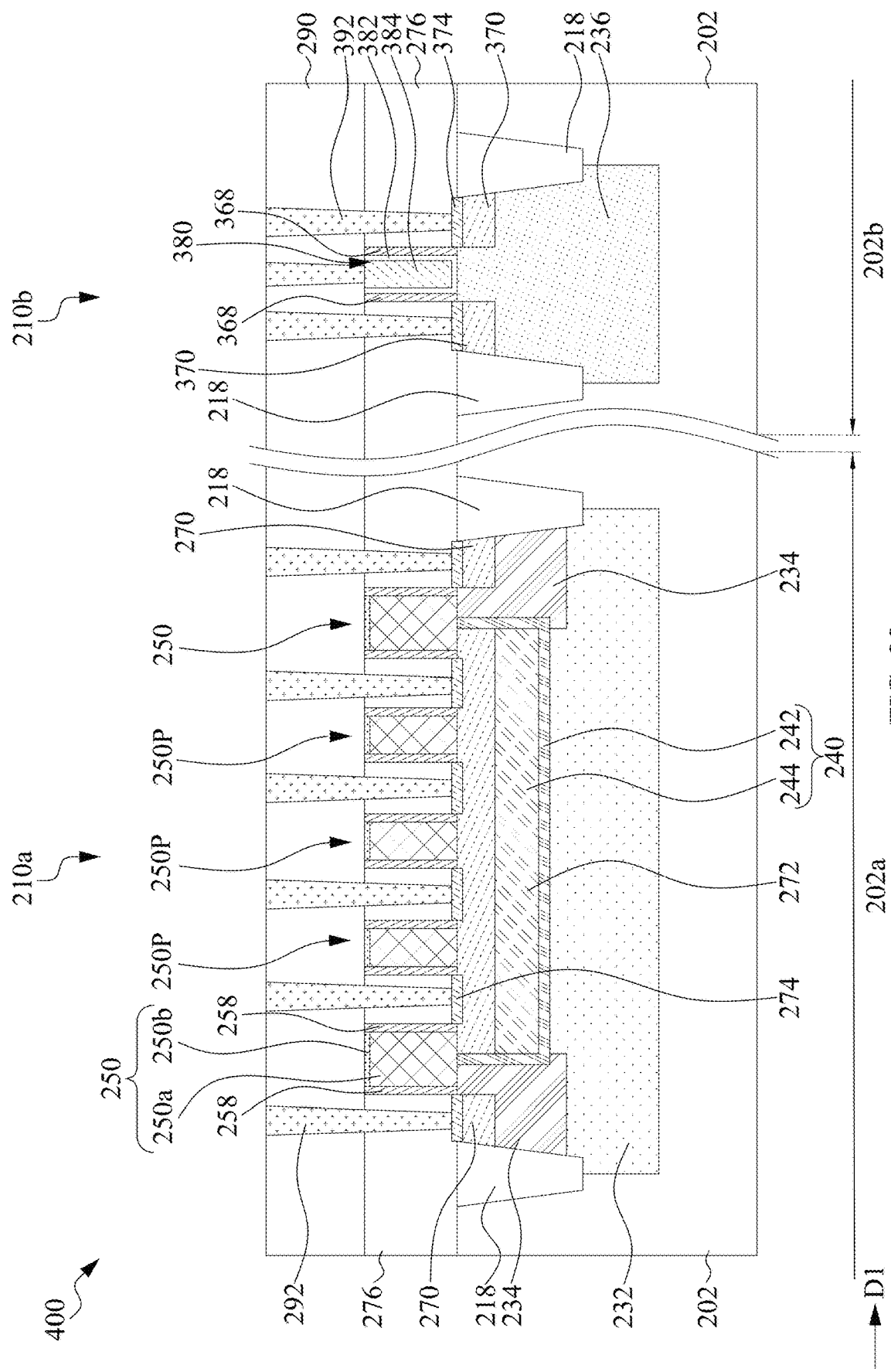
FIG. 32 is a cross-sectional view of a semiconductor structure at a fabrication stage according to aspects of one or more embodiments of the present disclosure.

FIG. 32 is a schematic drawing illustrating a semiconductor structure 400 at a fabrication stage according to aspects of one or more embodiments of the present disclosure. Referring to FIG. 32, a plurality of protection pillars 250P are formed instead of the gate stacks 280 previously discussed. In some embodiments, the protection pillars 250P and the protection structure 250 may be formed in a same formation process, and thus have the same height and are formed of the same materials. The protection pillars 250P are formed over the gate structure 240. The protection pillars 250P land on the gate electrode 244. The protection pillars 250P formed over the first-voltage device 210a may serve as protection structures. For example, the protection pillars 250P may serve as protection structures for protecting the underlying gate structure 240 during the planarization of the ILD layer 276.

Figure 33:
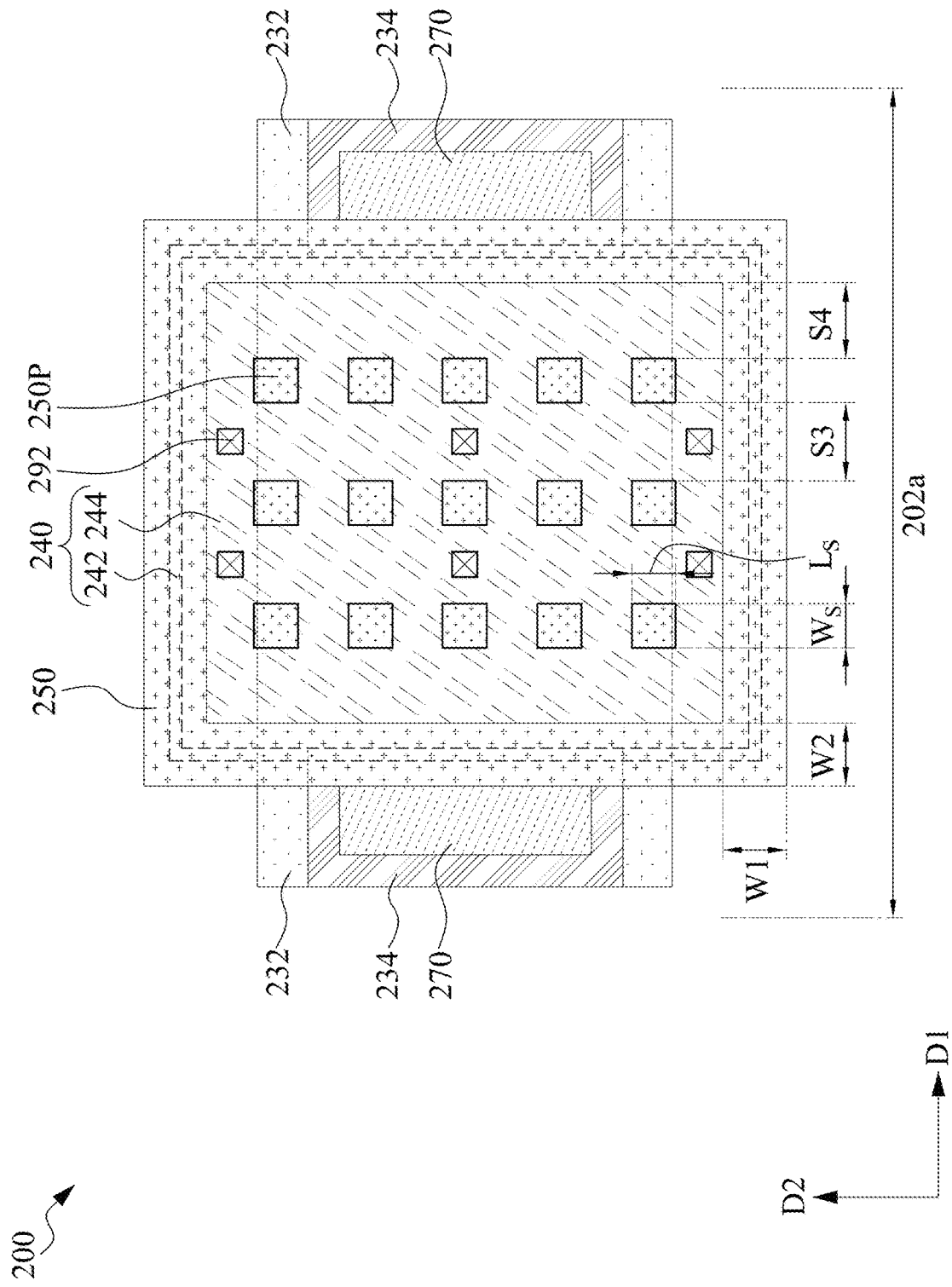
FIG. 33 illustrates a top view of a semiconductor structure according to aspects of one or more embodiments of the present disclosure.

FIG. 33 illustrates a top view of the protection pillars 250P, the protection structure 250, the gate structure 240, the source/drain regions 270, and the contact plugs 292 according to aspects of one or more embodiments of the present disclosure. The protection pillars 250P may a width $W_s$ and a length $L_s$. The width $W_s$ and the length $L_s$ may be substantially equal. The width $W_s$ may be in the range between about 0.4 μm and about 1.0 μm in accordance with some embodiments. The protection pillars 250P may have different configurations. In alternative embodiments, the width $W_s$ is different from the length $L_s$. The width $W_s$ may be less than the width W2 or the width W1 of the protection structure 250. In alternative embodiments, the width $W_s$ is substantially equal to the width W2 (or the width W1). The width $W_s$ and the length $L_s$ may be configured based on different requirements for different semiconductor devices.

A spacing S3 is arranged between two adjacent protection pillars 250P. The spacing S3 may be in the range between about 0.4 μm and about 1.0 μm in accordance with some embodiments. The spacing S3 may be greater than the width $W_s$. In some embodiments, a ratio of the width $W_s$ to the spacing S3 is less than 1. A spacing S4 is arranged between the protection structure 250 and the neighboring protection pillar 250P. In some embodiments, the spacing S4 is less than or substantially equal to the spacing S3. The spacing S3 and the spacing S4 may be configured based on different requirements for different semiconductor devices.

The protection pillars 250P land on the gate electrode 244. Each of the protection pillars 250P overlaps the gate electrode 244. In some embodiments, an area of the gate electrode 244 exposed from the protection structure 250 is defined as X. A total area of the protection pillars 250P overlapping the gate electrode 244 is defined as Z. A ratio Z/X may be in the range between about 50% and about 80% in accordance with some embodiments. The ratio Z/X may be also known as a pattern density of the protection pillars 250P. In other words, the pattern density of the protection pillars 250P may be in the range between about 50% and about 80%. The pattern density of the protection pillars 250P may be configured based on different requirements for different semiconductor devices.

The embodiments of the present disclosure have some advantageous features. It is desirable to allow the HV/MV MOS devices and the LV MOS devices to share the processes for forming replacement gates in order to reduce manufacturing cost. However, the planarization for exposing the dummy gate electrodes of the LV MOS devices may result in loss of the recessed gate electrodes of the HV/MV MOS devices. This means that the HV/MV MOS devices are unable to share the manufacturing processes in forming replacement gates of the LV MOS devices. By forming a protection structure to cover the HV/MV MOS devices and forming the dummy gate electrodes of the LV MOS devices (or forming protection pillars) over the recessed gate electrodes of the HV/MV MOS devices, the planarization may be performed without loss of the gate electrodes in HV/MV MOS devices. In addition, in accordance with the embodiments of the present disclosure, the method for the forming of the source/drain regions in the LV MOS devices may be used as the forming of the doped region in the gate electrode of HV/MV MOS devices during a same process, and hence the production cost is reduced.

In accordance with some embodiments of the present disclosure, a semiconductor structure includes: a substrate; a gate electrode disposed within the substrate; a gate dielectric layer disposed within the substrate and surrounding the gate electrode; a plurality of first protection structures formed in an array disposed over the gate electrode; and a second protection structure comprising a ring shape from a top-view perspective, and disposed over the gate dielectric layer and at a same level as the plurality of first protection structures from a cross-sectional view.

In accordance with some embodiments of the present disclosure, a semiconductor structure includes: a substrate including a first region and a second region; a first gate structure located within the substrate in the first region; a height-preserving structure located in the first region over the substrate; and a plurality of second gate structures disposed over the substrate adjacent to the height-preserving structure. The plurality of second gate structures are laterally surrounded by the height-preserving structure from a top-view perspective.

In accordance with some embodiments of the present disclosure, a method of forming a semiconductor structure includes: receiving a substrate; etching a recess in the substrate; forming a gate structure in the recess; forming a first etch-stop structure over the substrate, wherein the first etch-stop structure covers a boundary of the gate structure from a top-view perspective; and forming a plurality of second etch-stop structures over the gate structure adjacent to the first etch-stop structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a gate electrode disposed within the substrate;
   a gate dielectric layer disposed within the substrate and surrounding the gate electrode;
   a plurality of first protection structures formed in an array disposed over the gate electrode; and
   a second protection structure comprising a ring shape from a top-view perspective, and disposed over the gate dielectric layer and at a same level as the plurality of first protection structures from a cross-sectional view.

2. The semiconductor structure of claim 1, wherein each of the plurality of first protection structures includes a first conductive layer disposed over the substrate and overlapping the gate electrode.

3. The semiconductor structure of claim 2, wherein each of the plurality of first protection structures includes a first dielectric layer disposed between the respective first conductive layer and the substrate and overlapping the gate electrode.

4. The semiconductor structure of claim 3, wherein the first dielectric layer contacts the gate electrode.

5. The semiconductor structure of claim 1, wherein the second protection structure contacts the gate dielectric layer.

6. The semiconductor structure of claim 1, further comprising a doped region disposed in an upper portion of the gate electrode.

7. The semiconductor structure of claim 1, further comprising a plurality of silicide regions disposed between two adjacent first protection structures.

8. The semiconductor structure of claim 1, wherein the plurality of first protection structures are separated from each other.

9. The semiconductor structure of claim 1, wherein the second protection structure includes a second dielectric layer disposed over the substrate and overlapping the gate dielectric layer.

10. The semiconductor structure of claim 1, wherein a portion of the second protection structure overlaps the gate electrode from a top-view perspective.

11. A semiconductor structure, comprising:
    a substrate comprising a first region and a second region;
    a first gate structure located within the substrate in the first region;
    a height-preserving structure located in the first region over the substrate; and
    a plurality of second gate structures disposed over the substrate adjacent to the height-preserving structure, wherein the plurality of second gate structures are laterally surrounded by the height-preserving structure from a top-view perspective.

12. The semiconductor structure of claim 11, wherein the plurality of second gate structures overlap the first gate structure from a top-view perspective.

13. The semiconductor structure of claim 11, wherein the plurality of second gate structures contact the first gate structure.

14. The semiconductor structure of claim 11, further comprising a gate via electrically connected to the first gate structure, wherein the gate via is disposed between two adjacent ones of the plurality of second gate structures.

15. The semiconductor structure of claim 11, wherein a portion of the height-preserving structure extends beyond the first gate structure from a top-view perspective.

16. The semiconductor structure of claim 11, wherein a spacing between two adjacent ones of the plurality of second gate structures is greater than a width of one of the plurality of second gate structures.

17. A method of forming a semiconductor structure, comprising:
    receiving a substrate;
    etching a recess in the substrate;
    forming a gate structure in the recess;
    forming a first etch-stop structure over the substrate, wherein the first etch-stop structure covers a boundary of the gate structure from a top-view perspective; and
    forming a plurality of second etch-stop structures over the gate structure adjacent to the first etch-stop structure.

18. The method of claim 17, further comprising forming a plurality of silicide regions over the gate structure between two adjacent ones of the plurality of second etch-stop structures.

19. The method of claim 17, wherein the plurality of second etch-stop structures are in an array from a top-view perspective.

20. The method of claim 17, further comprising:
    forming a plurality of discrete doped regions in a gate electrode of the gate structure; and
    performing an annealing operation to transform the plurality of discrete doped regions into a continuous doped region.

* * * * *